US012676458B1

(12) United States Patent (10) Patent No.: US 12,676,458 B1
Campbell (45) Date of Patent: Jul. 7, 2026

(54) POLARIZATION MULTIPLEXED STRUCTURED LIGHT EMITTERS

(71) Applicant: Amazon Technologies, Inc., Seattle, WA (US)

(72) Inventor: Scott Patrick Campbell, Belmont, CA (US)

(73) Assignee: Amazon Technologies, Inc., Seattle, WA (US)

( * ) Notice: Subject to any disclaimer, the term of this patent is extended or adjusted under 35 U.S.C. 154(b) by 637 days.

(21) Appl. No.: 17/954,627

(22) Filed: Sep. 28, 2022

(51) Int. Cl.

| | |
|---|---|
| *H01S 5/183* | (2006.01) |
| *G02B 5/04* | (2006.01) |
| *G02B 5/18* | (2006.01) |
| *H01S 5/02253* | (2021.01) |

(52) U.S. Cl.
CPC ............ *H01S 5/18386* (2013.01); *G02B 5/04* (2013.01); *G02B 5/1842* (2013.01); *H01S 5/02253* (2021.01); *H01S 5/18355* (2013.01)

(58) Field of Classification Search
CPC ............. H01S 5/18386; H01S 5/02253; H01S 5/18355; G02B 5/04; G02B 5/1842
USPC .............................................. 372/50.1–20.23
See application file for complete search history.

(56) References Cited

U.S. PATENT DOCUMENTS

| | | | |
|---|---|---|---|
| 10,247,547 B2 | 4/2019 | Thuries et al. | |
| 2005/0140939 A1* | 6/2005 | Yamamoto ........... | H04N 9/3105 |
| | | | 348/E9.027 |

| | | | | |
|---|---|---|---|---|
| 2013/0188145 | A1* | 7/2013 | DeCusatis .............. | G03B 35/26 |
| | | | | 359/290 |
| 2016/0124241 | A1* | 5/2016 | Popovich ............. | G02B 5/1828 |
| | | | | 349/5 |
| 2019/0273906 | A1 | 9/2019 | Xiao et al. | |
| 2020/0142175 | A1* | 5/2020 | Cohen ................ | G02B 21/0084 |
| 2020/0278562 | A1 | 9/2020 | Huang et al. | |
| 2020/0387004 | A1 | 12/2020 | Xu et al. | |
| 2021/0066893 | A1 | 3/2021 | Jang et al. | |
| 2021/0247612 | A1* | 8/2021 | Hudman .................. | G02B 5/18 |
| 2021/0313778 | A1 | 10/2021 | Ginzburg | |

FOREIGN PATENT DOCUMENTS

| | | |
|---|---|---|
| CN | 103309137 A | 9/2013 |
| CN | 104237988 A | 12/2014 |

OTHER PUBLICATIONS

"Blazed Grating", Available Online at: https://en.wikipedia.org/wiki/Blazed_grating, 2021, 3 pages.

(Continued)

*Primary Examiner* — Bumsuk Won

(74) *Attorney, Agent, or Firm* — Kilpatrick Townsend & Stockton LLP

(57) ABSTRACT

A system includes a housing and a light emission source positioned within the housing and including a first light emitter array characterized by a first polarization state and a second light emitter array characterized by a second polarization state. The light emitted by the light emission source is configured to propagate along an optical axis. The system also includes a lens positioned within the housing along the optical axis and a wavefront modification element positioned within the housing along the optical axis. The wavefront modification element comprises a polarization-sensitive diffractive structure.

20 Claims, 15 Drawing Sheets

(56)                  References Cited

OTHER PUBLICATIONS

"Build to Order Transmission Diffraction Gratings," Available Online at: https://www.newport.com/g/custom-plane-transmission-gratings, Accessed from Internet on Nov. 29, 2022, 4 pages.

"Optics Expertise for High-Reliability, High-Volume Components," Available Online at: https://www.lumentum.com/en/diode-lasers/products/vcsels, Accessed from Internet on Nov. 29, 2022, 1 page.

"VCSEL Solutions & Photodiodes," Trumpf, Available Online at: https://www.trumpf.com/en_US/products/vcsel-solutions-photodiodes/, Accessed from Internet on Nov. 29, 2022, 1 page.

Campbell, U.S. Appl. No. 17/954,629, "Asymmetric Structured Light Emitter," filed Sep. 28, 2022.

Dorrah et al., "Metasurface Optics for On-Demand Polarization Transformations Along the Optical Path," Nature Photonics, Available Online at: https://capasso.seas.harvard.edu/files/capasso/files/s41566-020-00750-2.pdf, 2021, 12 pages.

Dorrah et al., "Structuring Total Angular Momentum of Light Along the Propagation Direction With Polarization-Controlled Meta-Optics," Nature Communications, vol. 12, No. 6249, 2021, 13 pages.

Dorrah et al., "Tunable Structured Light with Flat Optics," Science, vol. 376, Apr. 22, 2022, 12 pages.

Lim et al., "Engineering Phase and Polarization Singularity Sheets," Nature Communications, vol. 12, No. 4190, 2021, 10 pages.

Rubin et al., "Imaging Polarimetry Through Metasurface Polarization Gratings," Optics Express, vol. 30, No. 6, Mar. 14, 2022, pp. 9389-9412.

Rubin et al., "Jones Matrix Holography with Metasurfaces," Science Advances, vol. 7, No. 33, Aug. 13, 2021, 9 pages.

Shi et al., "High-Power and Single-Mode VCSEL Arrays with Single-Polarized Outputs by Using Package-Induced Tensile Strain," Optics Letters, vol. 45, No. 17, 2020, Abstract.

Zaidi et al., "Generalized Polarization Transformations with Metasurfaces", Optics Express, vol. 29, No. 24, Nov. 22, 2021, pp. 39065-39078.

Wang et al., "Blazed Grating Enables Highly Decoupled Optically Variable Devices Fabricated by Vibration-assisted Diamond Texturing," Optics express, vol. 30, No. 6, Mar. 14, 2022, pp. 8829-8846.

* cited by examiner

500

800

1100

1510

1520

1530

1510

1520    1550

1560

POLARIZATION MULTIPLEXED STRUCTURED LIGHT EMITTERS

CROSS-REFERENCE TO RELATED APPLICATION

The following non-provisional U.S. patent application is filed concurrently, and the entire disclosure of the other application is incorporated by reference into this application for all purposes:

U.S. application Ser. No. 17/954,629, filed Sep. 28, 2022, entitled "ASYMMETRIC STRUCTURED LIGHT EMITTER."

BACKGROUND

A diode laser emits light having spatial and temporal coherence. A vertical-cavity surface-emitting laser (VCSEL) is a type of diode laser with laser beam emission oriented perpendicular from the top surface. VCSELs can be fabricated in one-dimensional and two-dimensional arrays. Many user-related applications take advantage of laser arrays for depth sensing, shape sensing, laser scanning, and augmented reality. Despite the progress in the laser technology, light emitted by laser devices can be dangerous to the eyes.

BRIEF DESCRIPTION OF THE DRAWINGS

Various embodiments in accordance with the present disclosure will be described with reference to the drawings, in which.

DETAILED DESCRIPTION

Figure 1:
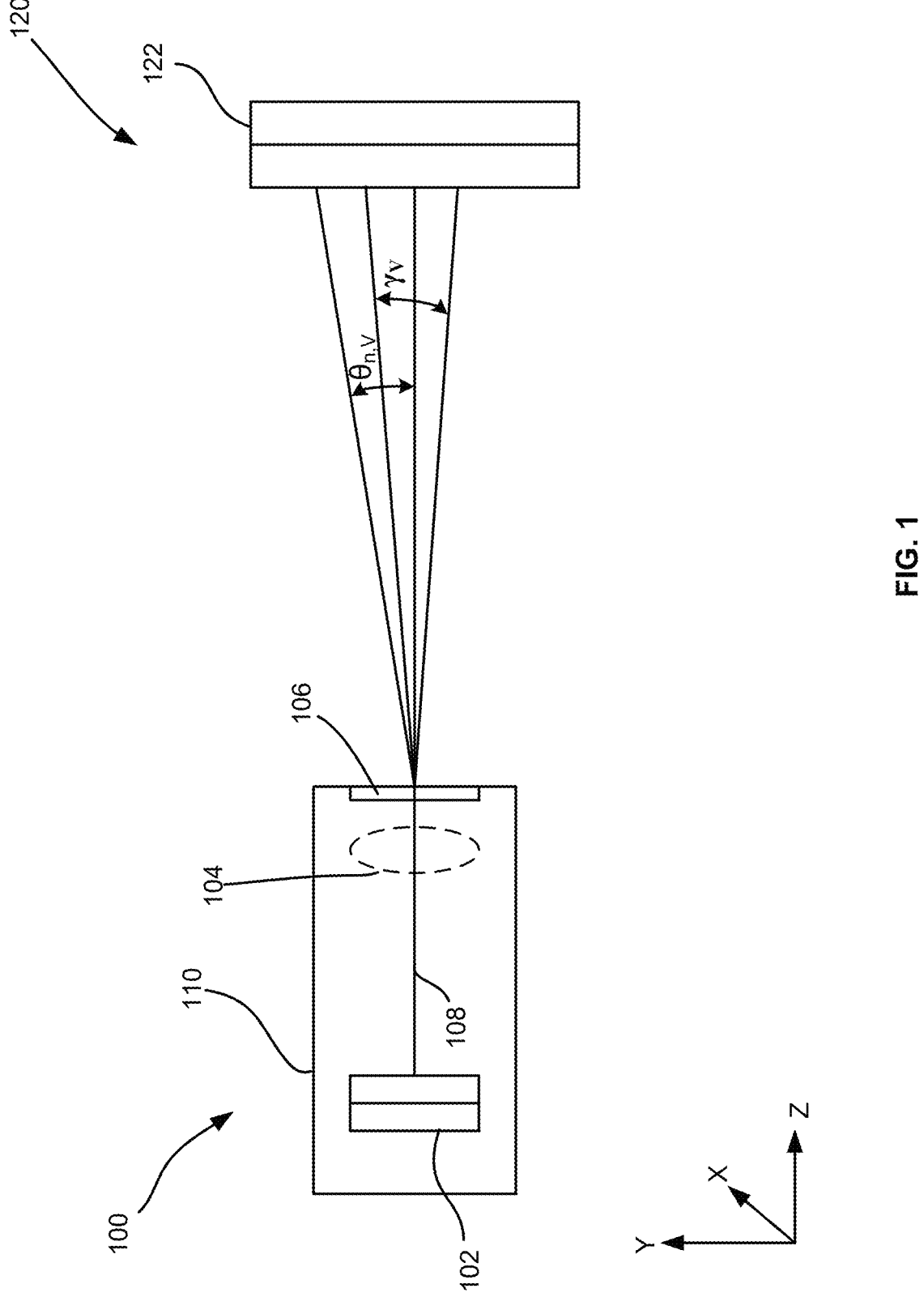
FIG. 1 is a simplified side view of a structured light emitter according to an embodiment of the present disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments of the present disclosure provide a structured light emitter that uses polarization multiplexing to emit different structured light patterns depending on the input radiation's polarization state. In this manner, a single structured light emitter module can emit multiple output light patterns based on the light polarization state. For example, one module can be used to emit either a dotted stripe pattern (in one polarization state) or a pseudo-random dot pattern (in an orthogonal polarization state), or to emit one pattern of light propagating along a downward angle for input light with a vertical polarization state (i.e., p-polarized light) and another pattern of light propagating along an outward angle for input light with a horizontal polarization (i.e., s-polarized light). This exemplary embodiment may reduce or minimize surface reflections corresponding to light reflecting off of a floor (e.g., using vertically-polarized light), or the like. the implementation of polarization multiplexing reduces cost and system complexity while increasing system flexibility and performance, particularly for robotics devices.

Meta-optics that include structures with sub-wavelength dimensions enable diffractive optical elements that respond to light having a first polarization state in a first manner and light having a second polarization state in a second manner. In other words, light with a first polarization state, for example, linearly polarized light with an s-polarization state, will be diffracted to form a first diffraction pattern while light with a second polarization state, for example, linearly polarized light with the p-polarization state will be diffracted to form a second diffraction pattern. This polarization-sensitive diffraction performance can be referred to as polarization multiplexing. As described more fully herein, embodiments of the present disclosure utilize polarization multiplexing to generate a set of far field diffraction patterns using a light source that includes light emission sources having different polarization states. Each of the far field diffraction patterns corresponds to one of the light emission sources, which may include multiple light emitters.

According to an embodiment of the present disclosure, a system is provided. The system includes a housing and a light emission source positioned within the housing and including a first light emitter array characterized by a first polarization state and a second light emitter characterized by a second polarization state. The light emitted by the light emission source is configured to propagate along an optical axis. The system also includes a diffractive optical element positioned within the housing along the optical axis. The diffractive optical element comprises a polarization-sensitive diffractive structure. The polarization-sensitive diffractive structure can be configured to generate, in a far field, a first diffraction pattern corresponding to the first light emitter array and a second diffraction pattern corresponding to the second light emitter. As an example, the second diffraction pattern can include a structured light array including a plurality of structured light patterns. Each structured light pattern of the plurality of structured light patterns can be a replica of the first light emitter array. The first diffraction pattern can be arrayed in one direction and the second diffraction pattern can be distributed in two directions. The system can also include an optical sensor mechanically coupled to the housing and operable to detect at least one of the first diffraction pattern or the second diffraction pattern. The first light emitter array can include a one-dimensional array of vertical cavity surface emitting lasers (VCSELs) and the second light emitter can include a two-dimensional pseudo-random distribution of VCSELs.

According to another embodiment of the present disclosure, a system is provided. The system includes a housing and a polarized light emission source disposed in the housing and operable to emit light along an optical axis. The polarized light emission source includes a plurality of light emitters. A first subset of the plurality of light emitters is characterized by a first polarization state (e.g., the p-polarization state) and a second subset of the plurality of light emitters is characterized by a second polarization state orthogonal to the first polarization state (e.g., the s-polarization state). The system also includes a diffractive optical element positioned within the housing along the optical axis. The diffractive optical element includes a polarization-sensitive diffractive structure configured to generate, in a far field, a first diffraction pattern corresponding to the first subset of the plurality of light emitters and a second diffraction pattern corresponding to the second subset of the plurality of light emitters. In an embodiment, the first subset of the plurality of light emitters can be arrayed as a first array including a predetermined number of light emitters arrayed in an array direction by an array dimension, the second subset of the plurality of light emitters can be arrayed as a second array including the predetermined number of light emitters arrayed in the array direction by the array dimension, and the second array can be offset from the first array in the array direction by half of the array dimension. The polarization-sensitive diffractive structure can implement an imaging lens function. As an example, the polarization-sensitive diffractive structure can deflect light in the first polarization state in a direction having a component aligned with the polarized light emission source. The first subset of the plurality of light emitters can include a predetermined number of light emitters aligned in a direction and the first diffraction pattern can include a plurality of structured light patterns. Each structured light pattern of the plurality of structured light patterns can be a replica of the predetermined number of light emitters. The plurality of structured light patterns can be aligned along the direction. The first diffraction pattern can be focused at a first distance from the diffractive optical element and the second diffraction pattern can be focused at a second distance from the diffractive optical element, the first distance being less than the second distance.

According to a specific embodiment of the present disclosure, a system is provided. The system includes a housing and a polarized light emission source disposed in the housing and operable to emit light along an optical axis. The polarized light emission source includes a plurality of light emitters. A first subset of the plurality of light emitters is characterized by a first polarization state and a second subset of the plurality of light emitters is characterized by a second polarization state orthogonal to the first polarization state. The system also includes a diffractive optical element positioned within the housing along the optical axis. The diffractive optical element includes a polarization-sensitive diffractive structure configured to generate, in a far field, a first diffraction pattern corresponding to the first subset of the plurality of light emitters and having a first field of irradiation and a second diffraction pattern corresponding to the second subset of the plurality of light emitters and having a second field of irradiation larger than the first field of irradiation. The first field of irradiation can be disposed inside the second field of irradiation. The first subset of the plurality of light emitters can be arrayed as a first array including a predetermined number of light emitters arrayed in an array direction by an array dimension, the second subset of the plurality of light emitters can be arrayed as a second array including the predetermined number of light emitters arrayed in the array direction by the array dimension, and the second array can be offset from the first array in the array direction by half of the array dimension. The first subset of the plurality of light emitters and the second subset of the plurality of light emitters can be operated independently. At least one of the first diffraction pattern or the second diffraction pattern can be characterized by a substantially uniform beam profile. The polarization-sensitive diffractive structure can implement an imaging lens function and a quarter wave plate, the first diffraction pattern can be characterized by a first elliptical polarization state and the second diffraction pattern can be characterized by a second elliptical polarization state having a handedness opposite to the first elliptical polarization state.

Embodiments of the present disclosure provide several technical advantages over conventional structured light emitters. For example, polarization multiplexing in an optical system including a structure light emitter and a camera provides benefits including better ambient light rejection. If a structured light emitter and its corresponding camera used to detect emitted light are polarization multiplexed, then half of the ambient light (i.e., the light in the orthogonal polarization state) can be rejected at the camera, substantially increasing the system's reach and/or signal to noise ratio. Additionally, embodiments of the present disclosure enable the projection of multiple structured light emitter patterns, depending on the polarization state, from a single structured light emitter component. Moreover, embodiments of the present disclosure provide ability to use polarization as an optical filter with respect to other structured light emitter patterns at the same or nearby optical wavelengths, thereby greatly reducing optical cross-talk between optical systems including a structured light emitter and a camera at the same or nearby optical wavelengths, or simply doubling the number of structured light emitter/camera channels a device including the optical system can support. Furthermore, embodiments of the present disclosure provide the ability to spatially map out surfaces that have specular reflection properties. Thus, surfaces in which light having a p-polarization state reflects off the surface with a lower reflectance than light having an s-polarization state can be spatially mapped out using embodiments of the present disclosure. It will be appreciated that although a limited number of polarization multiplexed structured light emitters are discussed herein, including four specific architectures, other possible structured light patterns and combinations of structured light patterns are included within the scope of the present disclosure.

FIG. 1 illustrates a side view of an example of a structured light emitter 100 with one light emitter array according to an embodiment of the present disclosure. The structured light emitter 100 may be part of an optical system that includes a time-of-flight camera (e.g., for depth sensing), a structured light scanner (e.g., for three-dimensional shape sensing), a dot projection camera (e.g., for three-dimensional shape sensing), a stereo camera system (e.g., for three-dimensional imaging), or other systems that project light and rely on the projected light to support a user-related application (e.g., depth sensing, shape sensing, laser scanning, augmented reality, or the like).

Although not shown in FIG. 1, the optical system may include a camera, a controller, a structured light emitter 100, and a set of sensor systems, among other components installed on a substrate (e.g., a power supply, a processor, and a memory). Light is emitted from the structured light emitter 100 and generates a structured light array 122 in a far field 120 so that image data can be generated by the camera to show an illuminated object (not shown in FIG. 1). The image data may be analyzed by the processor in support of the user-related application. For instance, within the context of depth sensing, the time-of-flight of the light is measured to determine the distance between the camera and the illuminated object.

The structured light emitter 100 may include a housing 110 in which a light emitter array 102, such as an array of diode lasers, for example, a vertical cavity surface emitter laser array, and a set of optical elements, such as a lens 104 and a diffractive optical element 106 are positioned. Light emitted by the light emitter array 102 can propagate along an optical axis 108. Each of the lens 104 and the diffractive optical element 106 can be positioned along the optical axis 108, with the lens 104 positioned between the light emitter array 102 and the diffractive optical element 106. The diffractive optical element 106 can include an optical power of the lens 104. Thus, in some embodiments, the optical power of the lens 104 is integrated into the diffractive optical element 106 and the lens 104 is not used. In turn, each or some of the optical elements in the structured light emitter 100 may include an electrically conductive material that is transparent to the light signals transmitted from the light emitter array 102. For example, the electrically conductive material may be an indium tin oxide layer, such as a coating or a film. The electrically conductive material on an optical element may be electrically coupled to the power supply and to one of the sensor systems.

The light emitter array 102 generates a particular light pattern (e.g., a pattern of light intensity peaks in an otherwise dark field) that is then imaged by an imaging optic (e.g., the lens 104), and then multiplied by the diffractive optical element 106. The diffractive optical element 106 is, generally, a diffraction grating in one or two dimensions that creates replicas of the light pattern of the light emitter array 102 in an array for each diffraction order. Each structured light pattern of the structured light array 122 is a replica of the light emitter array 102. The structured light patterns may be distorted, and thus the replicas can be inexact copies of the light emitter array 102. Parameters of the structured light emitter 100 can be selected to match an angular pitch of the replicas of the light emitter array 102 generated by the diffractive optical element 106 to an angular spread of a light field of the light emitter array 102, such that each replica of the light emitter array 102 is positioned side-by-side with its neighboring replicas in the far field 120.

In an example, the light emitter array 102 can have a number of light peaks (d), a horizontal dimension (H) of an active part of the light emitter array 102, a vertical dimension (V) of the active part of the light emitter array 102, and emit a total power (Pr). The lens 104 can have a focal length (f). The structured light emitter 100 can have a light efficiency (n), a diffraction angle in the vertical direction ($\theta_{n,V}$) for diffraction order n (similarly for $\theta'_{m,H}$ in the horizontal direction for diffraction order m), and a full angle ($\gamma_V$) in the vertical direction subtended by a single image of the light emitter array 102 (similarly for $\gamma_H$ in the horizontal direction). The far field 120 can include a total number of light intensity peaks (D), a power per light intensity peak (PD) in the far field 120, a horizontal field of irradiation (HFOI) in the far field 120, a number of diffractive orders emitted from the diffractive optical element 106 in the horizontal axis ($N_H$), a vertical field of irradiation (VFOI) in the far field 120, a number of diffractive orders emitted from the diffractive optical element 106 in the vertical axis ($N_V$), a far field light intensity peak count in the horizontal axis (h), a far field light intensity peak count in the vertical axis (v), and a light intensity peaks per degree in the far field 120 ($\delta$).

From this geometry, a model of the structured light array 122 in an ideal scenario (when $\theta_{n,V}=\gamma_V$ and $\theta_{m,H}=\gamma_H$) is derived by first recognizing that a given total field of irradiation is the emitted angular width per diffractive order in a given axis times the number of diffractive orders in a given axis. That is, $$HFOI = \frac{N_H * H}{f} \tag{1a}$$

$$VFOI = \frac{N_V * V}{f} \tag{1b}$$

As well, the total number of diffractive orders in a given axis, N, is given as $$N_H = 2 * m_H + 1 \tag{2a}$$

$$N_V = 2 * m_V + 1 \tag{2b}$$

where $m_H$ are the positive, non-zero diffractive orders in the horizontal axis and $m_V$ are the positive, non-zero diffractive orders in the vertical axis. As such, N is always an odd number.

By solving for the focal length in both of equations 1a-1b, it is determined that:

$$\frac{N_V}{N_H} = \frac{H}{V} * \frac{VFOI}{HFOI} \tag{3}$$

Furthermore, the total number of light intensity peaks in the far field 120 is given as:

$$D = d * N_H * N_V \tag{4}$$

And the power per light intensity peak in the far field 120 is given as:

$$P_D = \frac{P_T * \eta}{D} \tag{5}$$

It is also possible to calculate the number of light intensity peaks per axis in the far field 120, and the number of light intensity peaks per degree in the far field 120, given as:

$$h = \sqrt{D * \frac{HFOI}{VFOI}} \tag{6a}$$

$$v = \sqrt{D * \frac{VFOI}{HFOI}} \tag{6b}$$

$$\delta = \sqrt{\frac{D}{HFOI * VFOI}} \tag{7}$$

where h is the number of light intensity peaks in the horizontal axis in the far field 120, v is the number of light intensity peaks in the vertical axis in the far field 120, and δ is the number of light intensity peaks per degree in the far field 120.

Figure 2:
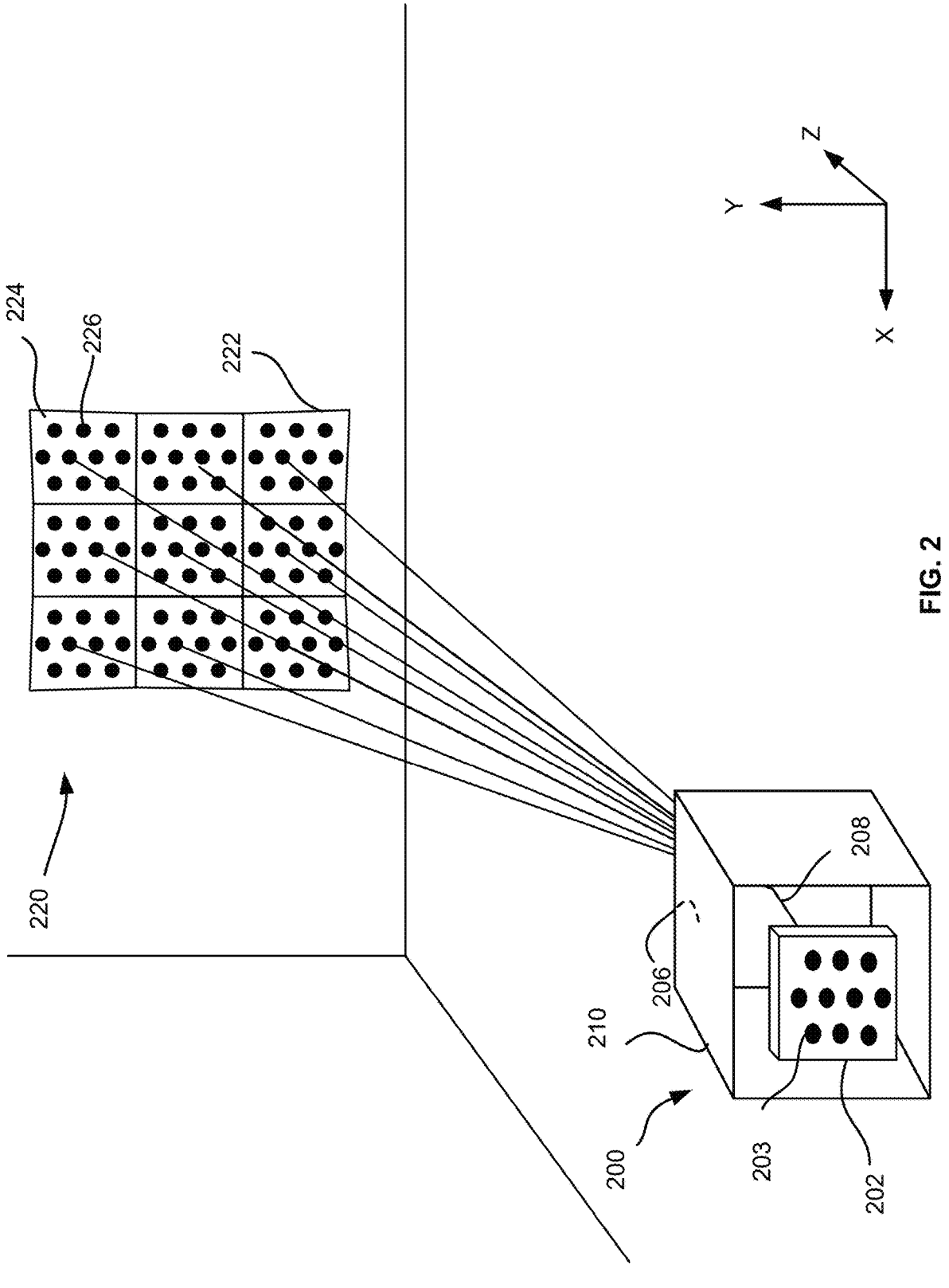
FIG. 2 is a simplified perspective view of the structured light emitter illustrated in FIG. 1 according to an embodiment of the present disclosure.

FIG. 2 illustrates a perspective view of an example of a structured light emitter 200 with one light emitter array according to an embodiment of the present disclosure. The structured light emitter 200 includes a housing 210 in which a light emitter array 202, such as an array of diode lasers, for example, a vertical cavity surface emitter laser array, and a set of optical elements, such as a lens (not shown) and a diffractive optical element 206 are positioned. Light emitted by the light emitter array 202 can propagate along an optical axis 208. Each of the lens and the diffractive optical element 206 can be positioned along the optical axis 208, with the lens positioned between the light emitter array 202 and the diffractive optical element 206. The diffractive optical element 206 can include an optical power of the lens. Thus, in the embodiment illustrated in FIG. 2, the optical power of the lens is integrated into the diffractive optical element 206 and the lens is not used. In turn, each or some of the optical elements in the structured light emitter 200 may include an electrically conductive material that is transparent to the light signals transmitted from the light emitter array 202. For example, the electrically conductive material may be an indium tin oxide layer, such as a coating or a film. The electrically conductive material on an optical element may be electrically coupled to the power supply and to one of the sensor systems.

The light emitter array 202 generates a particular light pattern (e.g., a pattern of light intensity peaks 203 in an otherwise dark field) that is then imaged by an imaging optic (e.g., a lens), and then multiplied by the diffractive optical element 206. The diffractive optical element 206 is, generally, a diffraction grating in one or two dimensions that creates replicas of the light pattern of the light emitter array 202 in an array for each diffraction order. Each structured light pattern 224 of the structured light array 222 is a replica of the light emitter array 202 and includes light intensity peaks 226 corresponding to the light intensity peaks 203 of the light emitter array 202. The light intensity peaks 226 of each structured light pattern 224 can be spatially separated. An intensity peak density of the light intensity peaks 226 may be non-uniform. The structured light patterns 224 may be distorted, and thus the replicas can be inexact copies of the light emitter array 202. Parameters of the structured light emitter 200 can be selected to match an angular pitch of the replicas of the light emitter array 202 generated by the diffractive optical element 206 to an angular spread of a light field of the light emitter array 202, such that each replica of the light emitter array 202 is positioned side-by-side with its neighboring replicas in the far field 220.

Although the structured light array 222 illustrated in FIG. 2 only multiplies the light emitter array 202 by a factor of three (i.e., a zero order and the +/−1 orders), embodiments of the present disclosure are not limited to this particular multiplication factor and in other embodiments, the multiplication factor may vary, for example multiplication of the light emitter array 202 by a factor of 7 horizontally (i.e., the zero order, and the +/−1, +/−2, and +/−3 orders) and by a factor of 5 vertically (i.e., the zero order, and the +/−1 and +/−2 orders).

It should be noted that a structured light emitter can be designed to be non-ideal, such that the angular width of the VCSEL's image, γ, does not equal the angular spacing of the grating's diffraction orders, θ. In such a case, there will either be gaps between the copies of the VCSEL's images (i.e., γ<θ), or portions of the VCSEL's images will overlap one another (i.e., γ>θ) in the far field.

Equations 1a-7 describe design parameters a given diffractive optical element-based structured light emitter for any particular VCSEL light source and desired structured light array including structured light patterns. Embodiments of the present disclosure extend the concept of a structured light emitter to include polarization multiplexing. As a result, the present disclosure makes reference to a polarization multiplexed structured light emitter in which two different present disclosure patterns are fused into a single polarization multiplexed present disclosure surface that is used in conjunction with a polarization multiplexed VCSEL array whose VCSELs are polarized and at least polarization-addressable, for example, row and/or column addressable. In this manner, embodiments of the present disclosure implement polarization-unique diffraction patterns that can include, for example, polarization-unique VCSEL irradiator patterns (i.e., in the VCSEL array), polarization-unique imaging lens focal lengths (i.e., to bring the images of the VCSEL array into best focus at various far field distances, even when the VCSEL-to-lens distance is fixed as discussed more fully in relation to the discussion of thin lens imaging, and polarization-unique diffractive multiplier gratings (i.e., to generate different forms of multiplied copies of the VCSEL arrays' structured light patterns).

Figure 3:
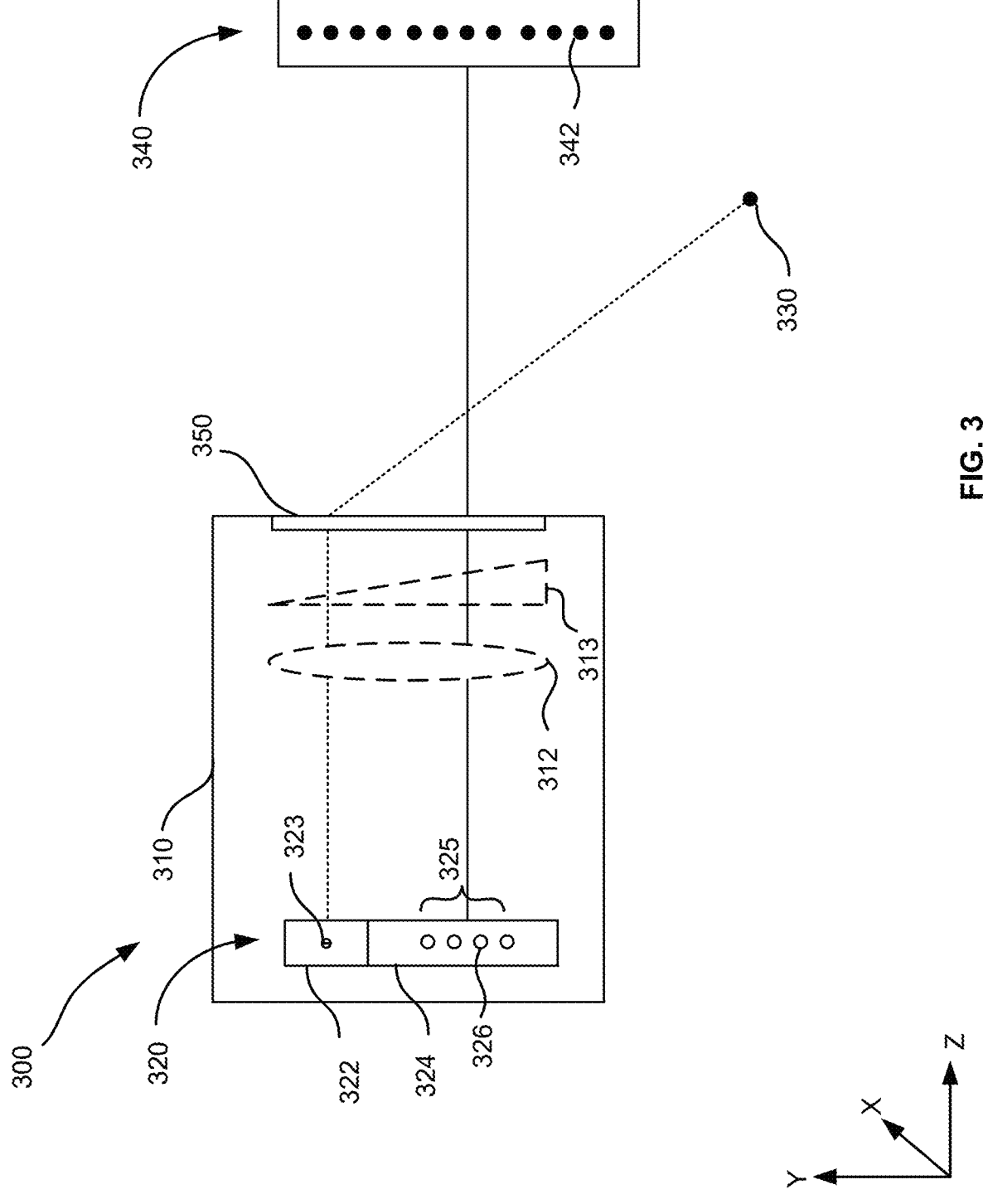
FIG. 3 is a simplified side view of a first polarization multiplexed structured light emitter according to an embodiment of the present disclosure.

FIG. 3 is a simplified side view of a first polarization multiplexed structured light emitter according to an embodiment of the present disclosure. In FIG. 3, a polarization multiplexed structured light emitter is utilized to produce a pattern of intensity peaks aligned in a row at a location in front of and below the polarization multiplexed structured light emitter and a pseudo-random pattern of intensity peaks in a far field. As explained below, a one-dimensional array of vertically-polarized light emitters (e.g., p-polarized VCSELs) is used to generate the pattern of intensity peaks aligned in a row at a location in front of and below the polarization multiplexed structured light emitter and a pseudo-random, two-dimensional distribution of horizontally polarized light emitters (e.g., s-polarized VCSELs) is used to generate the pseudo-random pattern of intensity peaks in the far field.

Figure 4:
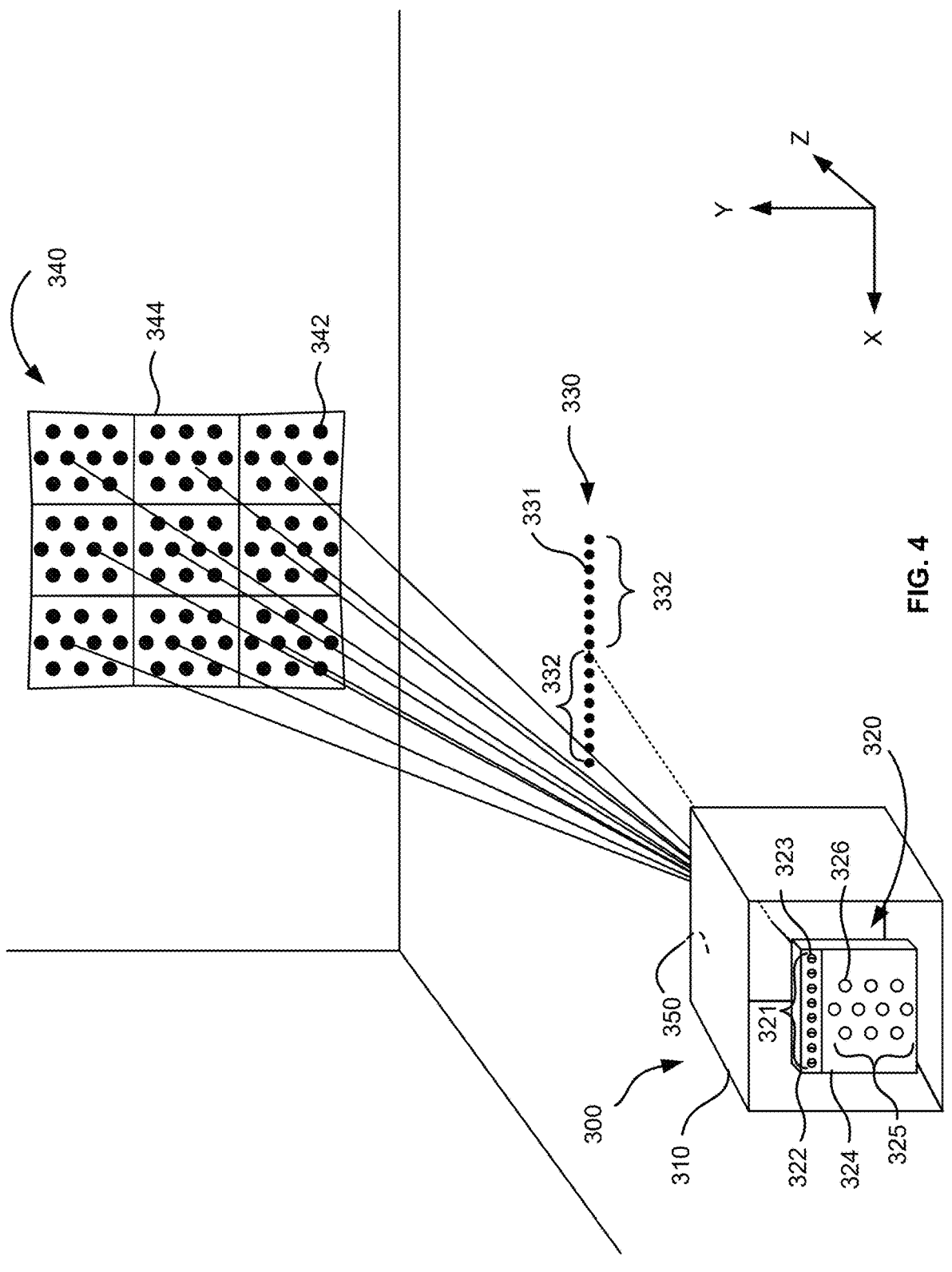
FIG. 4 is a simplified perspective view of the polarization multiplexed structured light emitter illustrated in FIG. 3 according to an embodiment of the present disclosure.

FIG. 4 is a simplified perspective view of the polarization multiplexed structured light emitter illustrated in FIG. 3 according to an embodiment of the present disclosure. Referring to FIGS. 3 and 4, a structured light emitter 300 includes a housing 310 that includes a light emission source implemented as a polarization multiplexed light emitter array 320 (e.g., a VCSEL array) positioned within the housing 310. The light emission source, i.e., the polarization multiplexed light emitter array 320, includes two regions, a first region 322 including a first light emitter array, i.e., a one-dimensional array 321 of light emitters 323 and a second region 324 including a second light emitter array, i.e., a two-dimensional, pseudo-random distribution 325 of light emitters 326. In the illustrated embodiment, each of the light emitters in the one-dimensional array 321 of light emitters 323 have a p-polarization state (i.e., are vertically polarized) and each of the light emitters in the two-dimensional, pseudo-random distribution 325 of light emitters 326 have a s-polarization state (i.e., are horizontally polarized). In an alternative embodiment, the one-dimensional array 321 of light emitters 323 can be implemented as a single light emitter, for example, a light bar, having the p-polarization state.

The one-dimensional array 321 of light emitters 323 and the two-dimensional, pseudo-random distribution 325 of light emitters 326 are individually addressable such that the activation of the one-dimensional array 321 of light emitters 323, since the light emitters are vertically polarized, produces a one-dimensional array of light intensity peaks 330 corresponding to the one-dimensional array of light emitters 323 and activation of the two-dimensional, pseudo-random distribution 325 of light emitters 326, since the light emitters are horizontally polarized, produces a structured light array 340 that includes multiple replicas of the two-dimensional, pseudo-random distribution 325 of light emitters 326. Thus, because the one-dimensional array 321 and the two-dimensional, pseudo-random distribution 325 are independently addressable, they can be operated independently in order to generate the one-dimensional array of light intensity peaks 330 of the structured light array 340 simultaneously, concurrently, in an alternating manner with one or the other generated at one time, or the like.

The polarization multiplexed diffractive optical element 350 is positioned within the housing 310 and includes a polarization-sensitive diffractive structure. As described more fully below, the polarization multiplexed diffractive optical element 350 diffracts light of different polarization states in different manners. Thus, for example, like having the p-polarization state will diffract differently than light having the s-polarization state. These polarization-sensitive diffraction effects can be implemented in one dimension or two dimensions as appropriate to the particular application. The polarization multiplexed diffractive optical element 350 can include a polarization multiplexed, imaging lens functionality that has different focal lengths for each polarization state. As a result, the one-dimensional array of light intensity peaks 330 is focused at a first distance measured along the Z-axis (e.g., 300 mm) from the structured light emitter 300 while the structured light array 340 that includes multiple replicas of the two-dimensional, pseudo-random distribution 325 of light emitters 326 is focused at a second distance measured along the Z-axis (e.g., 2,000 mm from the structured light emitter 300. In addition to the polarization multiplexed, imaging lens functionality with different focal lengths for each polarization state, the polarization multiplexed diffractive optical element 350 also includes a prismatic optic designed for the vertically polarized polarization state that directs the vertically polarized light, after diffraction by the polarization multiplexed diffractive optical element 350 in the negative Y-direction such that the one-dimensional array of light intensity peaks 330 is directed downward as illustrated in FIGS. 3 and 4. Thus, as shown in FIG. 4, the one-dimensional array of light intensity peaks 330 is focused onto the floor at a first distance in front of the structured light emitter 300 while the structured light array 340 that includes multiple replicas of the two-dimensional, pseudo-random distribution 325 of light emitters 326 is focused onto the wall located a second distance in front of the structured light emitter 300. In an embodiment, all of these optical elements are integrated as components of a single polarization multiplexed diffractive optical element (e.g., a single polarization multiplexed diffractive optical element layer). Optical functions including replication, imaging, and prismatic shift can be integrated in a single polarization multiplexed diffractive optical element, implemented independently using one or more refractive elements (e.g., the imaging lens and the prism) in conjunction with one or more diffractive optical elements, or combinations of thereof. As described herein, at least one of the optional imaging lens 312, the optional prism 313, and the polarization multiplexed diffractive optical element 350 are polarization-sensitive. Thus, in some embodiments, the polarization multiplexed diffractive optical element 350 can be implemented so that it generates the same output for both input polarizations, but generates the outputs independently depending on the polarization of the input light. In this case, two devices operating using different polarizations could be simultaneously, each device using one of two different polarizations. Combinations of one or more of the lens, the prism, and the polarization multiplexed diffractive optical element 350 can be referred to as a wavefront modification element. The lens and the prism can be polarization-sensitive or not polarization sensitive, thereby operating differently depending on the input polarization or not operating differently depending on the input polarization.

Referring to FIG. 4, the one-dimensional array of light intensity peaks 330 is characterized by a light pattern (e.g., a pattern of light intensity peaks 331 in an otherwise dark field) that includes multiple replicas of the one-dimensional array 321 of light emitters 323. Thus, the one-dimensional array of light intensity peaks 330 includes a plurality of structured light patterns 332, each including a plurality of light intensity peaks 331, corresponding to the one-dimensional array 321. Although only two structure light patterns 332 are illustrated for the one-dimensional array of light intensity peaks 330, this is merely exemplary and the number of the structure light patterns 332 can be much greater than two as is known to those of skill in the art. The orientation of the one-dimensional array of light intensity peaks 330 is aligned with the X-axis in this embodiment such that the orientation is aligned with the front of the structured light emitter 300 and is orthogonal to the optical axis of the polarization multiplexed light emitter array 320. In other embodiments, a prismatic effect operating along the X-direction can be integrated into the polarization multiplexed diffractive optical element in order to introduce a tilt of the one-dimensional array of light intensity peaks 330 with respect to the X-axis. The one-dimensional array of light intensity peaks 330 can be utilized in cliff-detection applications in which downward-directed light is utilized to detect discontinuities in the X-Z plane.

The structured light array 340 is characterized by a particular light pattern (e.g., a pattern of light intensity peaks 342 in an otherwise dark field) that includes multiple replicas of the two-dimensional, pseudo-random distribution 325 of light emitters 326. Thus, structured light array 340 includes a plurality of structured light patterns 344, each including a plurality of light intensity peaks 342. Although only 10 intensity peaks are illustrated for the two-dimensional, pseudo-random distribution 325 and the corresponding structure light patterns 344, this is merely exemplary. The light emitters 326 and light intensity peaks 342 can be distributed uniformly or non-uniformly, for example, in a pseudo-random pattern, and the number of light emitters 326 and intensity peaks can be greater or less than 10, for example greater than 100. The polarization multiplexed diffractive optical element 350 is, generally, a diffraction grating in one or two dimensions that creates replicas of the light pattern of the two-dimensional, pseudo-random distribution 325 in an array for each diffraction order. Each structured light pattern 344 of the structured light array 340 is a replica of the two-dimensional, pseudo-random distribution 325 and includes light intensity peaks 342 corresponding to the light emitters 323 of the two-dimensional, pseudo-random distribution 325. The light intensity peaks 342 of each structured light pattern 344 can be spatially separated. An intensity peak density of the light intensity peaks 342 may be non-uniform. The structured light patterns 344 may be distorted, and thus the replicas can be inexact copies of the two-dimensional, pseudo-random distribution 325. Parameters of the structured light emitter 300 can be selected to match an angular pitch of the replicas of the two-dimensional, pseudo-random distribution 325 generated by the polarization multiplexed diffractive optical element 350 to an angular spread of a light field of the two-dimensional, pseudo-random distribution 325, such that each replica of the two-dimensional, pseudo-random distribution 325 is positioned side-by-side with its neighboring replicas in the structured light array 340. Although a 3×3 array of replicas is illustrated in FIG. 4, this is merely exemplary and the structured light array 340 can include fewer rows and/or columns or a greater number of rows and/or columns. Moreover, blazed grating as discussed in U.S. patent application Ser. No. 17/954,629, filed Sep. 28, 2022, which is incorporated by reference, can be utilized to modify the replicas formed in the far field. Thus, the diffractive optical elements discussed in U.S. patent application Ser. No. 17/954,629, filed Sep. 28, 2022, can be utilized with embodiments of the present disclosure.

Considering one example of operation of the structured light emitter 300, when the pseudo-random dot pattern corresponding to the two-dimensional, pseudo-random distribution 325 of light emitters 326 is activated, the polarization multiplexed diffractive optical element responds to the horizontally polarized light emitted by the light emitters 326 (e.g., an array of horizontally polarized VCSELs) and images the emitted light so that it is focused at 2,000 mm measured along the Z-axis. The polarization multiplexed diffractive optical element then diffracts the emitted light to form a 7×7 array (+/−3 diffractive orders, plus the zero order) of replicas of the two-dimensional, pseudo-random distribution 325, directing the resulting structured light array 340 in a generally-forward direction, but spreading horizontally and vertically in the X-direction and the Y-direction, respectively, as per the diffraction orders and the nominal VCSEL array image angle emitted). Alternatively, when the one-dimensional array 321 of light emitters 323 is activated, the polarization multiplexed diffractive optical element responds to the vertically polarized light emitted by the light emitters 326 (e.g., an array of vertically polarized VCSELs) and images the emitted light so that it is focused at 300 mm measured along the Z-axis. The polarization multiplexed diffractive optical element then diffracts the emitted light to form a 1×17 array (+/−8 diffractive orders, plus the zero order) of replicas of the one-dimensional array 321 while prismatically refracting the resulting complete pattern in a downward direction. In alternative embodiments, an optional imaging lens 312 is utilized to supplement or replace optical power implemented in the polarization multiplexed diffractive optical element. Moreover, in some embodiments, an optional prism 313, which can also introduce different prismatic shifts for each polarization state, is utilized to supplement or replace prismatic shift implemented in the polarization multiplexed diffractive optical element. Additionally, although focal lengths of 300 mm and 2,000 mm for vertically polarized and horizontally polarized light respectively, are utilized in the example above, embodiments of the present disclosure are not limited to these particular values and other suitable values for the focal lengths can be utilized. One of ordinary skill in the art would recognize many variations, modifications, and alternatives. Moreover, the optional imaging lens 312 can be a polarization multiplexed, imaging lens that has different focal lengths for each polarization state.

Figure 12:
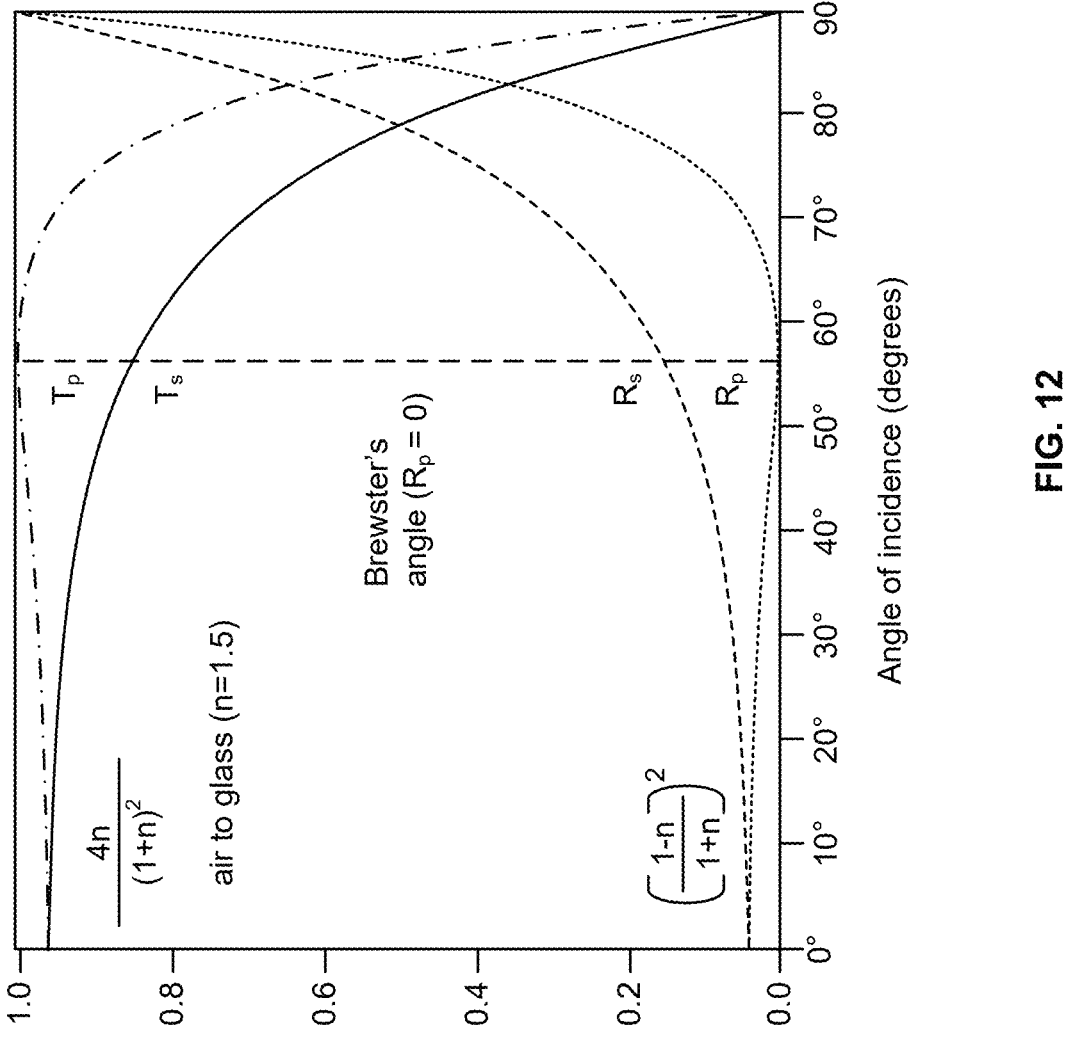
FIG. 12 is a plot showing transmittance and reflectance as a function of the angle of incidence for s-polarized and p-polarized light.

A benefit of using vertically polarized light to form the downward-aiming one-dimensional array of light intensity peaks 330 is that, due to Fresnel reflection properties, light coming into a specular surface at a sizeable angle reflects less when the polarization state of the light is parallel to the plane of incidence, but reflects more when the polarization state of the light is perpendicular to the plane of incidence as discussed more fully in relation to FIG. 12. Vertically polarized light is polarized in the plane of incidence for a downward-aiming light pattern directed onto a floor. Working in conjunction with a camera or other optical sensor, vertically polarized light will be detected by a camera detecting vertically polarized light while ambient light that is reflected from the floor will be predominantly horizontally polarized and not readily detected by the camera.

Both patterns can be turned on simultaneously or concurrently. Alternatively, one pattern can be turned on at a time or neither pattern can be turned on. In this manner, the one-dimensional array of light intensity peaks 330 shines and focuses onto the floor near the structured light emitter 300 light in the one-dimensional array of light intensity peaks 330 experiences minimal reflection off the floor due to the vertical polarization state (i.e., the p-polarization state) of light emitters 326, while the structured light array 340 corresponding to the multiplied replicas of the two-dimensional, pseudo-random distribution 325 shines out into the room and focuses on more distant objects in the room. Additionally, using meta-optic polarization multiplexed diffractive optical elements, the function of the imaging lenses can be co-integrated into a singular meta-optic surface with the diffractive functions.

Figure 5:
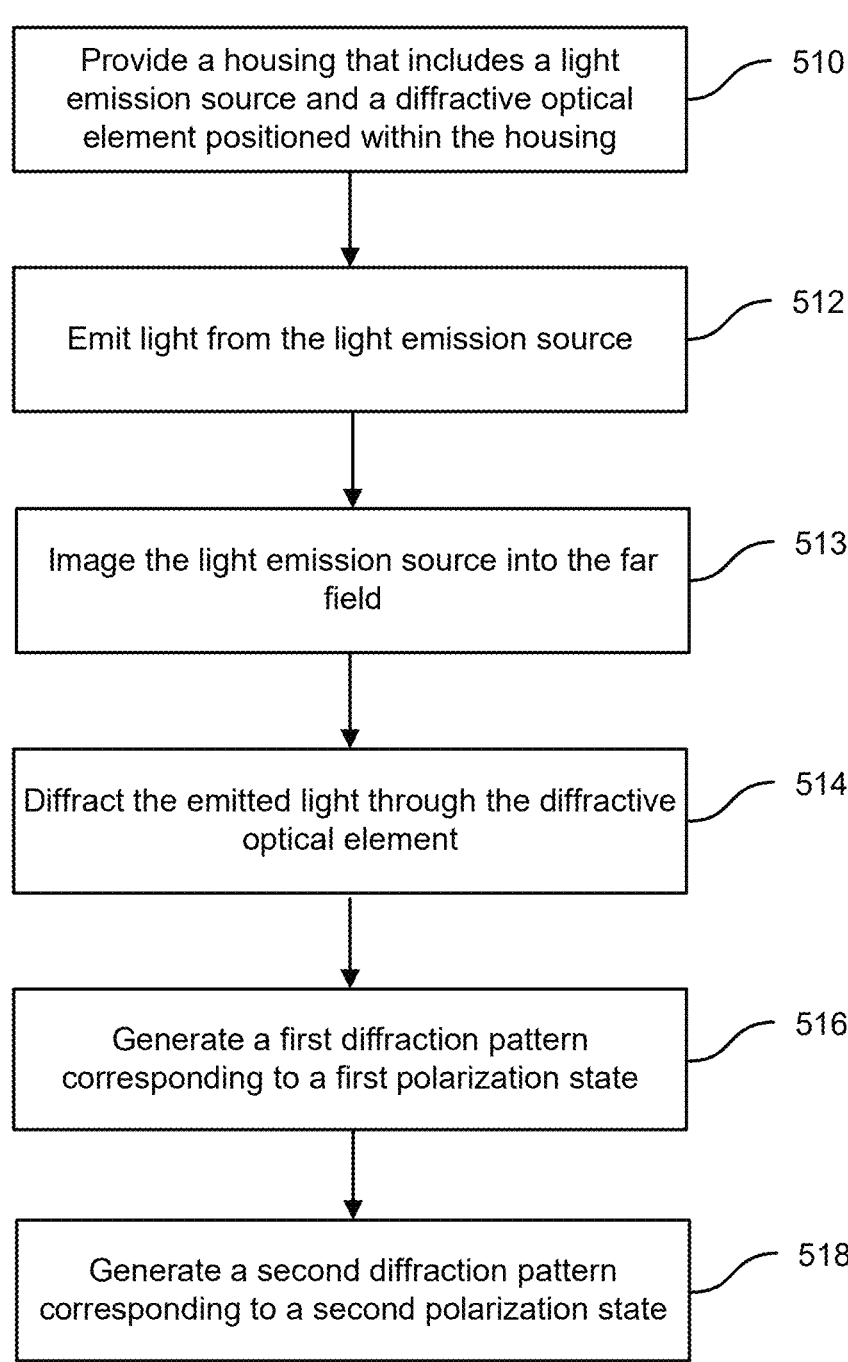
FIG. 5 is a simplified flowchart illustrating a method of operating a polarization multiplexed structured light emitter according to an embodiment of the present disclosure.

FIG. 5 is a simplified flowchart illustrating a method of operating a polarization multiplexed structured light emitter according to an embodiment of the present disclosure. The method 500 includes providing a housing that includes a light emission source and a diffractive optical element positioned within the housing (510). The light emission source includes a first light emitter array characterized by a first polarization state and a second light emitter characterized by a second polarization state. The first light emitter array can be a one-dimensional array of vertical cavity surface emitting lasers (VCSELs) and the second light emitter can be a two-dimensional pseudo-random distribution of VCSELs. The light emitted by the light emission source is configured to propagate along an optical axis. The diffractive optical element is positioned within the housing along the optical axis. The diffractive optical element comprises a polarization-sensitive diffractive structure.

The method also includes emitting light from the light emission source (512) and imaging the light emission source into the far field (513). Operation 513 can be performed using a lens or a lensing effect incorporated into a diffractive optical element. The size of the replicas will be a function of the imaging process. Thus, the light emission source can be imaged by a lens that is positioned along the optical axis. Additionally, optional prismatic shift can be implemented. The method further includes diffracting the emitted light through the diffractive optical element (514). Diffraction through the diffractive optical element results in the generation, in a far field, of a first diffraction pattern corresponding to the first light emitter array (516) and a second diffraction pattern corresponding to the second light emitter (518). The second diffraction pattern can include a structured light array that includes a plurality of structured light patterns. Each structured light pattern of the plurality of structured light patterns can include a replica of the first light emitter. The first diffraction pattern can be arrayed in one direction and the second diffraction pattern can be distributed in two directions. In some embodiments, the method also includes detecting at least one of the first diffraction pattern or the second diffraction pattern using an optical sensor mechanically coupled to the housing.

It should be appreciated that the specific steps illustrated in FIG. 5 provide a particular method of operating a polarization multiplexed structured light emitter according to an embodiment of the present disclosure. Other sequences of steps may also be performed according to alternative embodiments. For example, alternative embodiments of the present disclosure may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
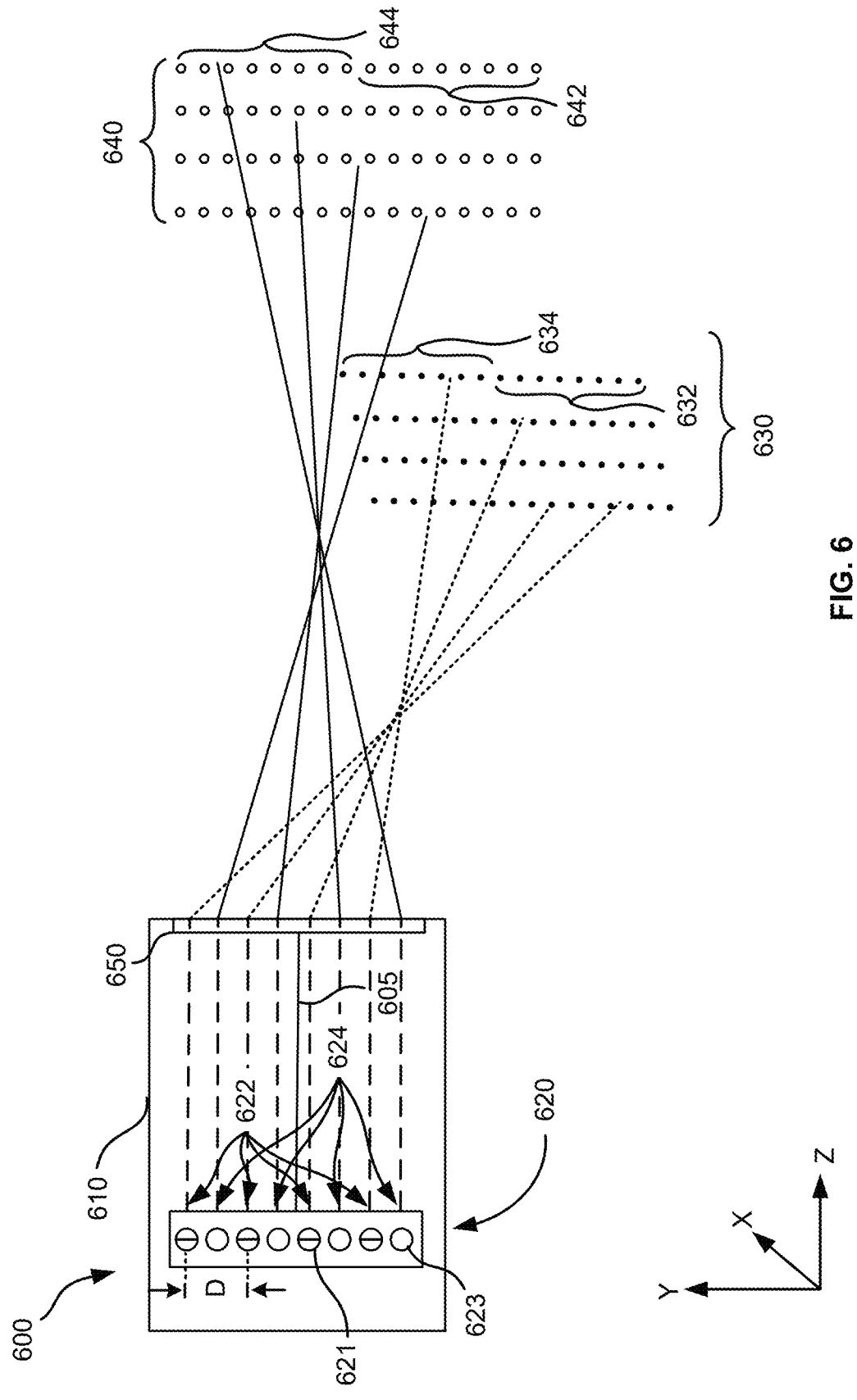
FIG. 6 is a simplified side view of a second polarization multiplexed structured light emitter according to an embodiment of the present disclosure.

FIG. 6 is a simplified side view of a second polarization multiplexed structured light emitter according to an embodiment of the present disclosure.

Figure 7:
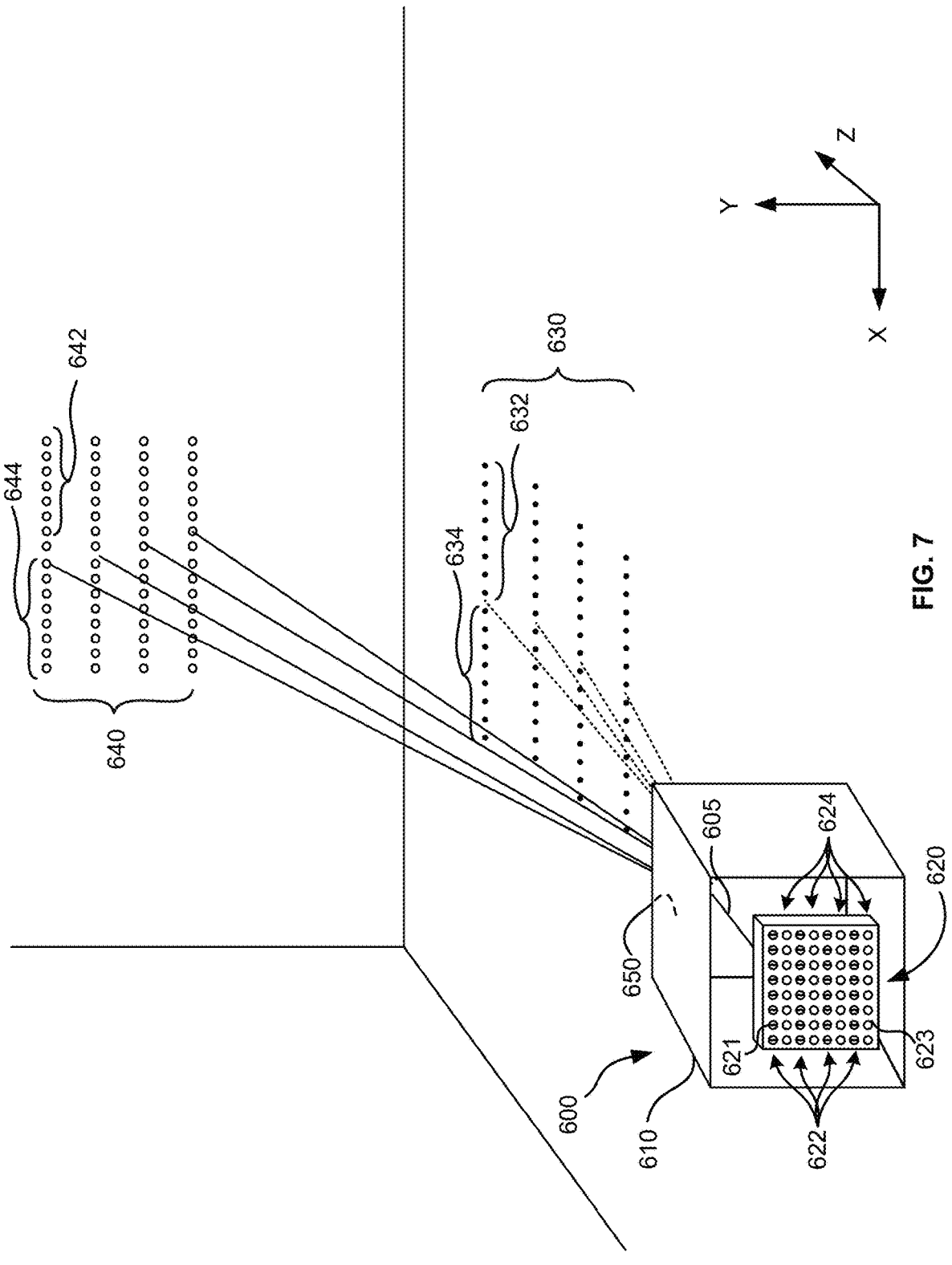
FIG. 7 is a simplified perspective view of the structured light emitter illustrated in FIG. 6 according to an embodiment of the present disclosure.

FIG. 7 is a simplified perspective view of the structured light emitter illustrated in FIG. 6 according to an embodiment of the present disclosure.

Referring to FIGS. 6 and 7, a structured light emitter 600 includes a housing 610 and a polarized light emission source 620 disposed in the housing 610. The polarized light emission source 620 is operable to emit light along an optical axis 605. As illustrated in FIGS. 6 and 7, the polarized light emission source 620 includes a plurality of light emitters. A first subset of the plurality of light emitters 622 is characterized by a first polarization state (e.g., a vertical or p-polarization state) and a second subset of the plurality of light emitters 624 is characterized by a second polarization state orthogonal to the first polarization state (e.g., a horizontal or s-polarization state). Although some embodiments are illustrated utilizing light having a vertical/p-polarization state and a horizontal/s-polarization state, other embodiments can use right hand circularly polarized and left hand circularly polarized light with different handedness or elliptically polarized light with different handedness. The design of the diffractive optical element 650 will correspond to the polarization state of the light emitted by the polarized light emission source 620 in order to provide polarization-sensitive diffraction patterns in the far field.

In the illustrated embodiment, the first subset of the plurality of light emitters 622 is formed by a plurality of rows, i.e., 4 rows in the illustrated embodiment, of individual light emitters 621, i.e., 8 individual light emitters in the illustrated embodiment. The second subset of the plurality of light emitters 624 is formed by a plurality of rows, i.e., 4 rows in the illustrated embodiment, of individual light emitters 623, i.e., 8 individual light emitters in the illustrated embodiment. The first subset of the plurality of light emitter is 622 is interleaved with the second subset of the plurality of light emitters 624 to form the polarized light emission source 620 so that alternating rows of light emitters have alternating polarization states. Although a specific number of rows and columns of individual light emitters is illustrated, the specific number of rows and columns is merely illustrative and other numbers of rows and columns of individual light emitters can be utilized.

A diffractive optical element 650 is positioned within the housing along the optical axis 605. The diffractive optical element 650 includes a polarization-sensitive diffractive structure (i.e., is a polarization multiplexed diffractive optical element) that responds differently to different polarization states and is configured to generate, in the far field, a first diffraction pattern 630 corresponding to the first subset of the plurality of light emitters 622 and a second diffraction pattern 640 corresponding to the second subset of the plurality of light emitters 624. Thus, the polarization multiplexed diffractive optical element is able to form the first diffraction pattern 630 based on the polarization state of the individual light emitters 621 in the first subset of the plurality of light emitter 622 and the second diffraction pattern 640 based on the polarization state of the individual light emitters 623 in the first subset of the plurality of light emitter 624. Because the first subset of the plurality of light emitters 622 is arrayed as a first array including a predetermined number of individual light emitters 621 (e.g., 8 light emitters with p-polarization) arrayed in an array direction (i.e., the y-direction) by an array dimension (i.e., D) and the second subset of the plurality of light emitters 624 is arrayed as a second array including the predetermined number of individual light emitters 623 (e.g., 8 light emitters with s-polarization) arrayed in the array direction (i.e., the y-direction) by the array dimension (i.e., D), the second array can be offset from the first array in the array direction by half of the array dimension (i.e., D/2). As described more fully below, this spacing of the two subsets of light emitters enables interleaving of the subsets as well as for spacings between rows of the diffraction patterns. The polarization multiplexed diffractive optical element can implement an imaging lens function as illustrated in FIGS. 6 and 7 or a separate lens can be utilized as illustrated in FIG. 3. In column-based implementations, D will be measured along the X-axis.

The diffraction patterns can be formed at various locations in the X-Y plane and at various longitudinal distances along the Z-axis. As an example, in some embodiments, the polarization multiplexed diffractive optical element deflects light in the first polarization state in a direction having a component aligned with the polarized light emission source. Thus, as illustrated in FIG. 7, p-polarized light is deflected in the negative Y-direction by the polarization multiplexed diffractive optical element.

Referring to the diffraction patterns formed by the structured light emitter 600, the first diffraction pattern 630 and the second diffraction pattern 640 extend into the plane of the figure along the X-direction, but are illustrated as lying in the Y-Z-plane for purposes of clarity. The diffraction patterns can multiply the subsets of light emitters. As an example, since the first subset of the plurality of light emitters 622 includes a predetermined number of individual light emitters 621 aligned in a direction (i.e., the x-direction), the first diffraction pattern 630 includes a plurality of structured light patterns 632 and 634, wherein each structured light pattern 632/634 of the plurality of structured light patterns comprises a replica of the predetermined number of light emitters. Thus, structured light pattern 632 is a first replica of the first subset of the plurality of light emitters 622 and structured light pattern 634 is a second replica of the first subset of the plurality of light emitters 622. Similarly, structured light pattern 642 is a first replica of the second subset of the plurality of light emitters 624 and structured light pattern 644 is a second replica of the second subset of the plurality of light emitters 624. As illustrated in FIG. 7, the plurality of structured light patterns 632/634 and 642/ 644 are aligned along the X-direction since the individual light emitters 621/623 are aligned along the X-direction. Although only two replicas are illustrated for each subset of light emitters, the number of replicas can be more or less and replicas can be formed along several directions (e.g., along both the X-direction and the Y-direction) as is known to one of skill in the art. Moreover, the number of replicas corresponding to each polarization can also differ. Additionally, because the focal length imparted by the polarization multiplexed diffractive optical element can vary for each polarization, the first diffraction pattern 630 can be focused at a first distance measured along the Z-axis from the diffractive optical element 650 and the second diffraction pattern 640 can be focused at a second distance measured along the Z-axis from the diffractive optical element 650. In the embodiment illustrated in FIGS. 6 and 7, the first distance is less than the second distance.

Thus, as illustrated in FIGS. 6 and 7, two angle-tunable, dotted stripe patterns, one corresponding to downward-aiming dotted stripes for vertically polarized light emitters and the other corresponding to forward-aiming dotted stripes for horizontally polarized light emitters can be produced. The polarized light emission source 620 used to generate both of these diffraction patterns has several individually-addressable rows of light emitters (e.g., VCSELs), with some rows emitting vertically polarized light and other rows emitting horizontally polarized light. In the illustrated embodiment, the polarized light emission source 620 has 8 VCSELs in each row and 4 rows, although this is not required and in other embodiments, the polarized light emission source 620 has 8 vertically polarized VCSELs in each of 8 rows, with these 8 rows interlaced with 8 rows of horizontally polarized VCSELs, for a total of 8×16 VCSELs in the polarized light emission source 620). Although FIGS. 6 and 7 illustrate two sets of polarized light emitters, arrayed in the Y-direction and interleaved, this is merely exemplary and in other embodiments, the light emitters can be implemented in a column-based geometry, implemented in a checkerboard configuration, implemented as two pseudo-random distributions, which can be interleaved, or the like.

Figure 8:
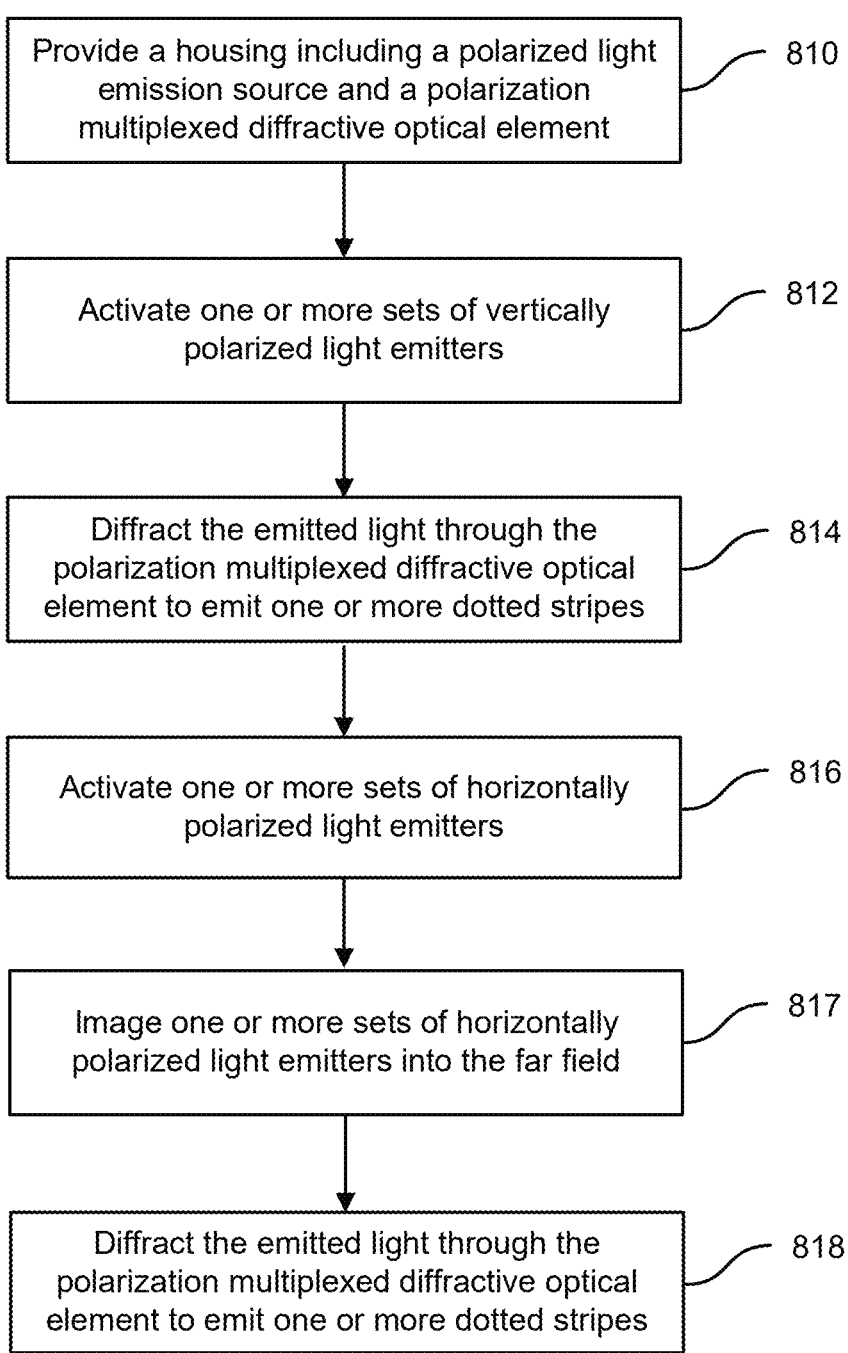
FIG. 8 is a simplified flowchart illustrating a method of operating a polarization multiplexed structured light emitter according to another embodiment of the present disclosure.

FIG. 8 is a simplified flowchart illustrating a method of operating a polarization multiplexed structured light emitter according to another embodiment of the present disclosure. The method 800 includes providing a housing including a polarized light emission source with a plurality of light emitters and a polarization multiplexed diffractive optical element (810). The polarized light emission source includes a first subset of light emitters characterized by a first polarization state and a second subset of light emitters characterized by a second polarization state orthogonal to the first polarization state. The first subset of the plurality of light emitters can be implemented as a predetermined number of rows of light emitters positioned along the X-direction with a spacing between rows defined by an array dimension (i.e., D) measured in an array direction (i.e., the Y-direction). The second subset of the plurality of light emitters can be implemented as a predetermined number of rows of light emitters that are offset from the first array in the array direction by half of the array dimension so that the rows of vertically polarized light emitters are interleaved with the rows of horizontally polarized light emitters.

The method also includes activating one or more of sets (e.g., rows) of vertically polarized light emitters (i.e., p-polarized VCSELs) (812) and diffracting the emitted light through the polarization multiplexed diffractive optical element to emit one or more downward-aiming dotted stripes (814). Each separate set or row of vertically polarized light emitters will result in the generation of a dotted stripe at a slightly different downward angle. The method further includes activating one or more of the horizontally polarized sets (e.g., rows) of light emitters (i.e., s-polarized VCSELs) (816) and imaging the one or more of the horizontally polarized sets of light emitters into the far field (817). Operation 817 can be performed using a lens or a lensing effect incorporated into a polarization multiplexed diffractive optical element. The size of the replicas will be a function of the imaging process. Thus, the one or more of the horizontally polarized sets of light emitters can be imaged by a lens that is positioned along the optical axis. Additionally, optional prismatic shift can be implemented. The method further includes diffracting the emitted light through the polarization multiplexed diffractive optical element to emit one or more forward-aiming dotted stripes (818). Each separate set or row of horizontally polarized light emitters will result in the generation of a dotted stripe at a slightly different forward angle. This fine-tuning in the emission angle, i.e., by selecting a given row with a given polarization state, takes place due to the Fourier transforming properties of the imaging lens implemented into or utilized in conjunction with the polarization multiplexed diffractive optical element, which converts a light emitter row height into a vertical output angle unique to that row height and the imaging lens' focal length. Additionally, using a meta-optic polarization multiplexed diffractive optical element, the imaging lenses can also be co-integrated into the singular meta-optic surface with the polarization multiplexed diffractive optical element. Moreover, prismatic effects can be built into the polarization multiplexed diffractive optical element to enable redirection of the diffraction patterns corresponding to each polarization state.

In addition to separately or concurrently activating the one or more of sets of vertically polarized light emitters and the one or more of the horizontally polarized sets of light emitters in a row-based configuration, the vertically and horizontally polarized light emitters in a column can be activated in a column-based configuration. In this implementation, a column of emission peaks would be produced in the X-Z plane and in the far field (i.e., the X-Y plane). These columns could then be scanned in the X-direction by activating the subsequent columns of vertically and horizontally polarized light emitters, for example, initially the columns on the left and subsequently the columns to the right.

It should be appreciated that the specific steps illustrated in FIG. 8 provide a particular method of operating a polarization multiplexed structured light emitter according to another embodiment of the present disclosure. Other sequences of steps may also be performed according to alternative embodiments. For example, alternative embodiments of the present disclosure may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications.

One of ordinary skill in the art would recognize many variations, modifications, and alternatives.

Figure 9:
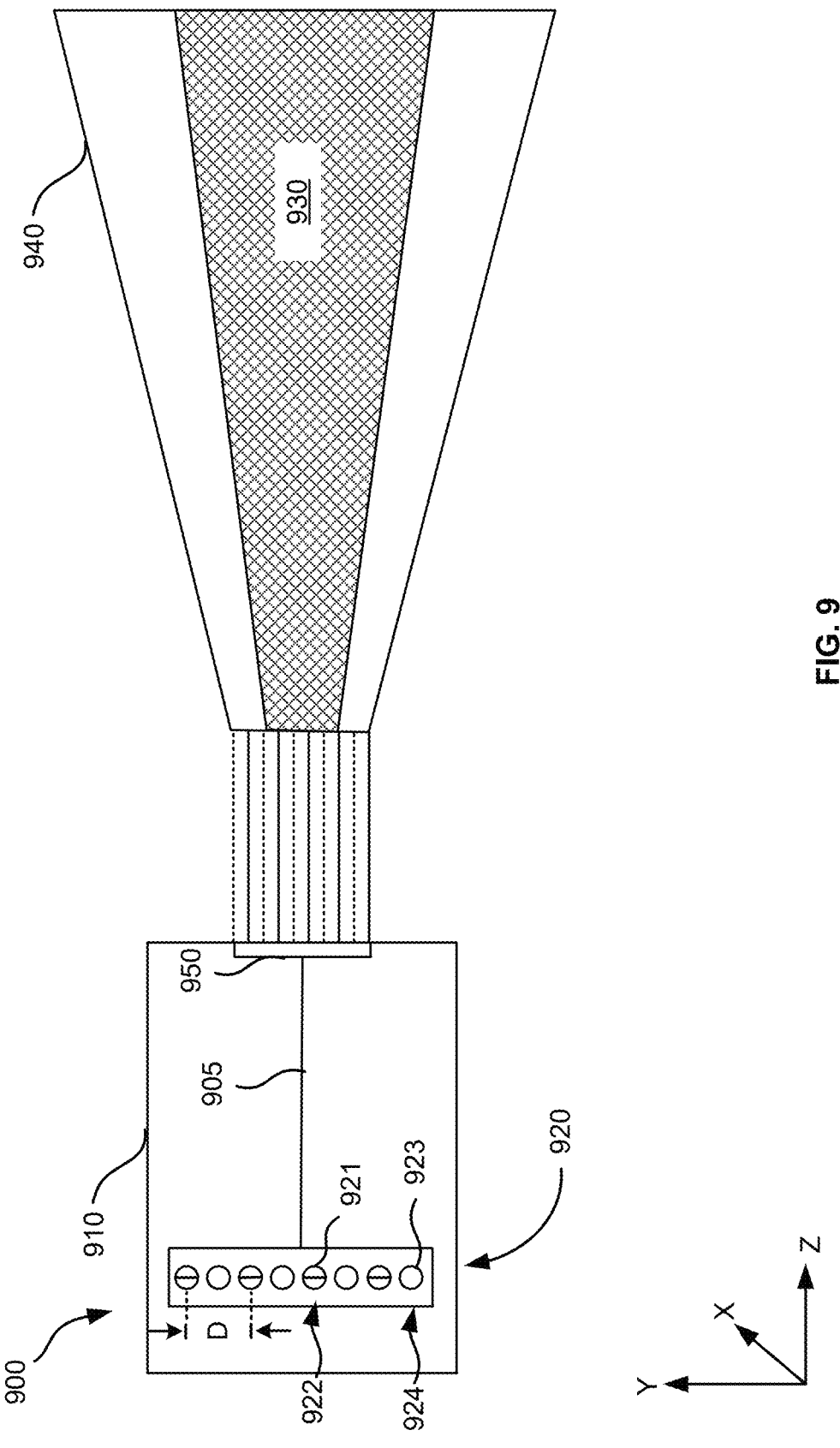
FIG. 9 is a simplified side view of a third polarization multiplexed structured light emitter according to an embodiment of the present disclosure.

FIG. 9 is a simplified side view of a third polarization multiplexed structured light emitter according to an embodiment of the present disclosure.

Figure 10:
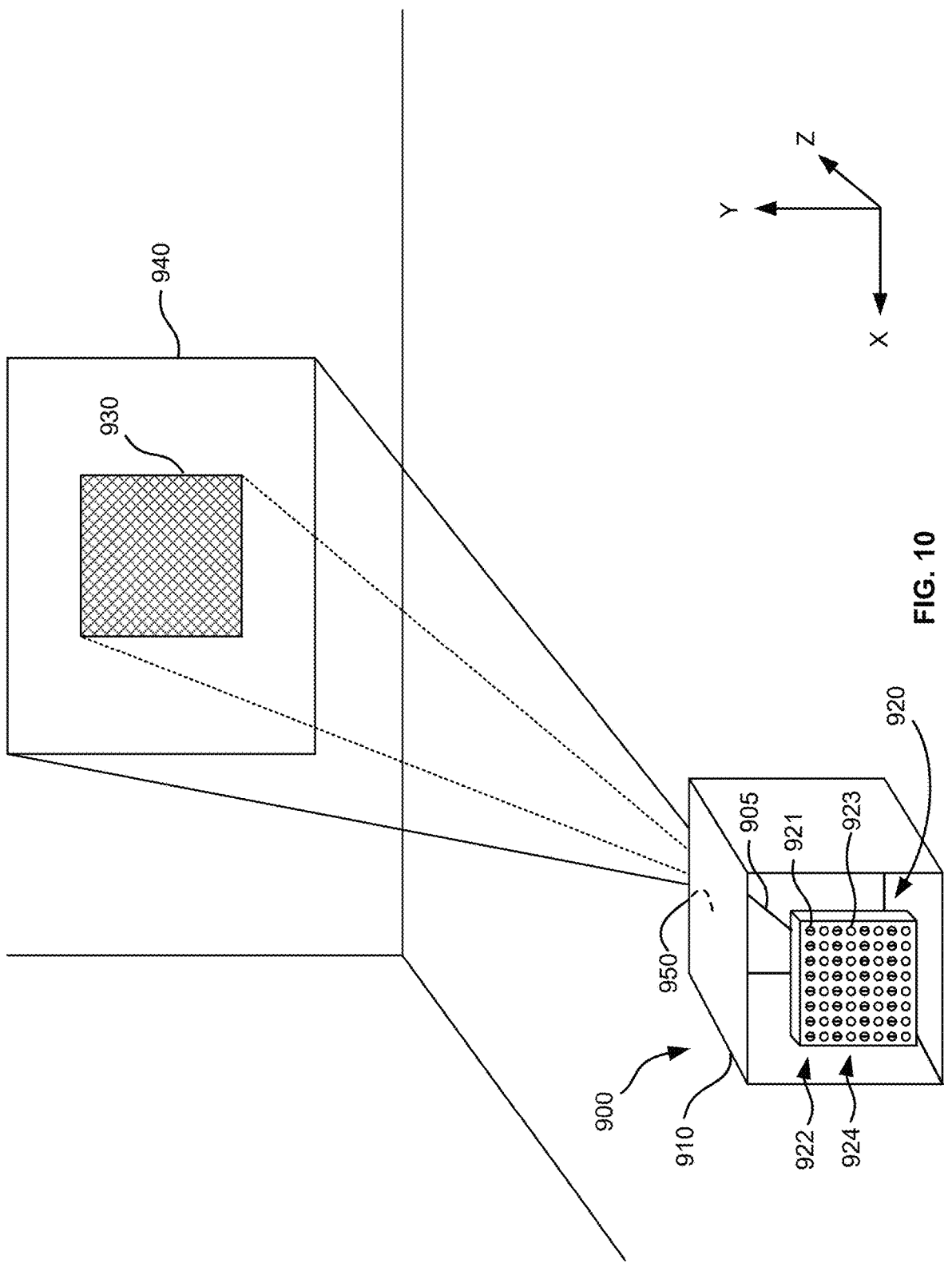
FIG. 10 is a simplified perspective view of the structured light emitter illustrated in FIG. 9 according to an embodiment of the present disclosure.

FIG. 10 is a simplified perspective view of the structured light emitter illustrated in FIG. 9 according to an embodiment of the present disclosure.

Referring to FIGS. 9 and 10, a structured light emitter 900 includes a housing 910 and a polarized light emission source 920 disposed in the housing 910. The polarized light emission source 920 is operable to emit light along an optical axis 905. As illustrated in FIGS. 9 and 10, the polarized light emission source 920 includes a plurality of light emitters. A first subset of the plurality of light emitters 922 is characterized by a first polarization state (e.g., a vertical or p-polarization state) and a second subset of the plurality of light emitters 924 is characterized by a second polarization state orthogonal to the first polarization state (e.g., a horizontal or s-polarization state). In the illustrated embodiment, the first subset of the plurality of light emitters 922 is formed by a plurality of rows, i.e., 4 rows in the illustrated embodiment, of individual light emitters 921, i.e., 8 individual light emitters in the illustrated embodiment. The second subset of the plurality of light emitters 924 is formed by a plurality of rows, i.e., 4 rows in the illustrated embodiment, of individual light emitters 923, i.e., 8 individual light emitters in the illustrated embodiment. The first subset of the plurality of light emitter is 922 is interleaved with the second subset of the plurality of light emitters 924 to form the polarized light emission source 920 so that alternating rows of light emitters have alternating polarization states. Although a specific number of rows and columns of individual light emitters is illustrated, the specific number of rows and columns is merely illustrative and other numbers of rows and columns of individual light emitters can be utilized.

A diffractive optical element 950 is positioned within the housing along the optical axis 905. The diffractive optical element 950 includes a polarization-sensitive diffractive structure (i.e., is a polarization multiplexed diffractive optical element) that responds differently to different polarization states and is configured to generate, in the far field, a first diffraction pattern 930 corresponding to the first subset of the plurality of light emitters 922 and a second diffraction pattern 940 corresponding to the second subset of the plurality of light emitters 924. Thus, the polarization multiplexed diffractive optical element is able to form the first diffraction pattern 930 based on the polarization state of the individual light emitters 921 in the first subset of the plurality of light emitter 922 and the second diffraction pattern 940 based on the polarization state of the individual light emitters 923 in the first subset of the plurality of light emitter 924. Because the first subset of the plurality of light emitters 922 is arrayed as a first array including a predetermined number of individual light emitters 921 (e.g., 8 light emitters with p-polarization) arrayed in an array direction (i.e., the y-direction) by an array dimension (i.e., D) and the second subset of the plurality of light emitters 924 is arrayed as a second array including the predetermined number of individual light emitters 923 (e.g., 8 light emitters with s-polarization) arrayed in the array direction (i.e., the y-direction) by the array dimension (i.e., D), the second array can be offset from the first array in the array direction by half of the array dimension (i.e., D/2). As described more fully below, this spacing of the two subsets of light emitters enables interleaving of the subsets as well as for spacings between rows of the diffraction patterns. The polarization multiplexed diffractive optical element can implement an imaging lens function as illustrated in FIGS. 9 and 10 or a separate lens can be utilized as illustrated in FIG. 3. Moreover, as discussed above, in addition to column-based activation implementations, row-based activation implementations are included within the scope of the present disclosure. Additionally, in addition to column and row configurations, checkerboard patterns, random distributions, and the like can be utilized.

The diffractive optical element 950 includes several different optical features implemented by a combination of an imaging lens, a quarter-wave plate set with its axes oriented at 45 degrees to the incident light's polarizations, which converts the two input linearly-polarized light states into two circularly-polarized light states, and a polarization multiplexed diffuser. The polarization multiplexed diffuser diffuses the light out into first diffraction pattern 930, which is a narrow pattern corresponding to the first input polarization state (i.e., the p-polarization state) and into second diffraction pattern 940, which is a wide pattern corresponding to the other input polarization state (i.e., the s-polarization state). Thus, as illustrated in FIG. 10, the first diffraction pattern 930 is positioned within the second diffraction pattern 940. In FIG. 10, the centers of the first diffraction pattern 930 and the second diffraction pattern 940 are aligned, but this is not required. Although the diffuse light patterns illustrated in relation to this embodiment are characterized by a uniform intensity, this is not required and in other embodiments, the intensity can vary for example, have a reduced intensity near the edges of the diffraction pattern, have an increased intensity near the edges of the diffraction pattern, or the like. Moreover, the different diffraction patterns, each corresponding to one polarization state, can have different intensity profiles. One of ordinary skill in the art would recognize many variations, modifications, and alternatives.

It should be noted that a similar device could also be built without the quarter-wave plate. This similar device would emit two linear polarization states rather than two circularly-polarized states. The benefit of converting the light emitters' (e.g., VCSELs') linearly-polarized light into circularly-polarized light is that circularly-polarized light reflects off objects more similarly than linearly-polarized light does. As discussed above, using meta-optic polarization multiplexed diffractive optical elements, the imaging lenses can also be co-integrated into the singular meta-optic surface with the polarization multiplexed diffractive optical elements.

Thus, referring to the diffraction patterns formed by the structured light emitter 900, the first diffraction pattern 930 has a first field of irradiation and the second diffraction pattern 940 has a second field of irradiation larger than the first field of irradiation.

Thus, as illustrated in FIGS. 9 and 10, a telephoto and wide angle flood irradiator is provided by this embodiment, with the telephoto flood irradiator corresponding to vertically polarized light emitters and the wide angle flood irradiator corresponding to horizontally polarized light emitters. The polarized light emission source 920 used to generate both of these diffraction patterns has several individually-addressable rows of light emitters (e.g., VCSELs), with some rows emitting vertically polarized light and other rows emitting horizontally polarized light. In the illustrated embodiment, the polarized light emission source 920 has 8 VCSELs in each row and 4 rows, although this is not required and in other embodiments, the polarized light emission source 920 has 8 vertically polarized VCSELs in each of 8 rows, with these 8 rows interlaced with 8 rows of horizontally polarized VCSELs, for a total of 8×16 VCSELs in the polarized light emission source 920). Thus, as discussed more fully in relation to FIG. 11, selective activation of either or both of the telephoto and wide angle flood irradiators can be achieved.

In some embodiments, rather than providing telephoto and wide angle flood irradiation patterns, different irradiation patterns are provided. The irradiation patterns do not need to overlap and one irradiation pattern does not have to be smaller and concentric with the other. As an example, the first and second irradiation pattern could have different shapes, for instance, a horizontal rectangle or a vertical rectangle. As another example, two irradiation patterns next to each other, with some or no overlap (e.g., tiled), could provide right-hand irradiation or left-hand irradiation. The sizes and the angles at which the irradiation patterns are centered can vary as appropriate to the particular application. Thus, the wide angle and telephoto irradiation pattern illustrated in FIGS. 9 and 10 is merely exemplary and the irradiation patterns can be overlapping, partially overlapping, not overlapping, larger or smaller, different sizes, different aspect ratios, directed at different angles, or the like. Since the individual light emitters or sets of light emitters can be activated independently, two devices, each using a different polarization, could be operated in the same area, with a first device emitting a first irradiation pattern and the second device emitting a second irradiation pattern with substantially no cross-talk. By changing the polarization of the emitted light, the irradiation patterns could be switched, with the first device emitting the second irradiation pattern and the second device emitting the first irradiation pattern. One of ordinary skill in the art would recognize many variations, modifications, and alternatives.

Figure 11:
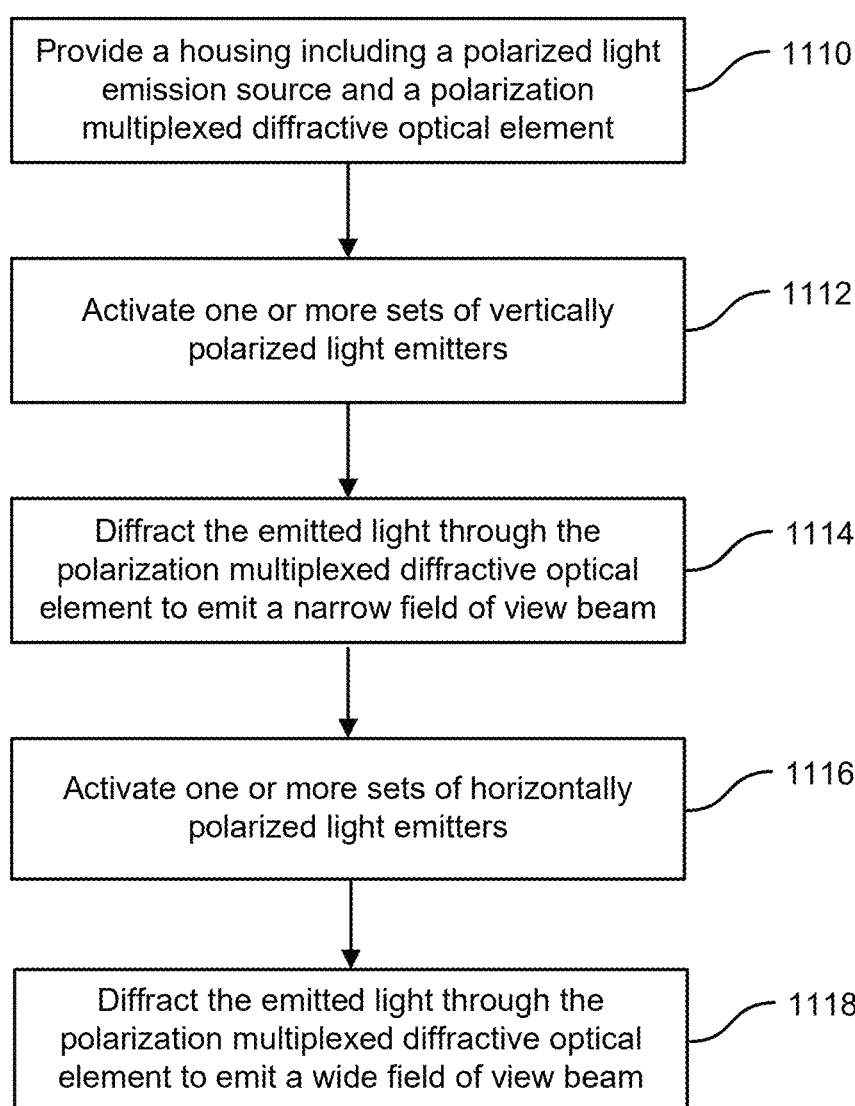
FIG. 11 is a simplified flowchart illustrating a method of operating a polarization multiplexed structured light emitter according to yet another embodiment of the present disclosure.

FIG. 11 is a simplified flowchart illustrating a method of operating a polarization multiplexed structured light emitter according to yet another embodiment of the present disclosure. The method 1100 includes providing a housing including a polarized light emission source with a plurality of light emitters and a polarization multiplexed diffractive optical element (1110). The polarized light emission source includes a first subset of light emitters characterized by a first polarization state and a second subset of light emitters characterized by a second polarization state orthogonal to the first polarization state. The first subset of the plurality of light emitters can be implemented as a predetermined number of rows of light emitters positioned along the X-direction with a spacing between rows defined by an array dimension (i.e., D) measured in an array direction (i.e., the Y-direction). The second subset of the plurality of light emitters can be implemented as a predetermined number of rows of light emitters that are offset from the first array in the array direction by half of the array dimension so that the rows of vertically polarized light emitters are interleaved with the rows of horizontally polarized light emitters.

The method also includes activating one or more of sets (e.g., rows) of vertically polarized light emitters (i.e., p-polarized VCSELs) (1112) and diffracting the emitted light through the polarization multiplexed diffractive optical element to emit a narrow field of irradiation beam (1114). The method further includes activating one or more of the horizontally polarized sets (e.g., rows) of light emitters (i.e., s-polarized VCSELs) (1116) and diffracting the emitted light through the polarization multiplexed diffractive optical element to emit a wide field of irradiation beam (1118).

It should be appreciated that the specific steps illustrated in FIG. 11 provide a particular method of operating a polarization multiplexed structured light emitter according to yet another embodiment of the present disclosure. Other sequences of steps may also be performed according to alternative embodiments. For example, alternative embodiments of the present disclosure may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

It should be noted that the diffraction patterns produced in the various embodiments discussed above can be interchanged as appropriate to the particular application. For example, second diffraction pattern 640 illustrated in FIG. 6 could be replaced with either first diffraction pattern 930 or second diffraction pattern 940 illustrated in FIG. 9. Thus, in this alternative embodiment, a cliff detection application can be combined with a flood illuminator application in a single device. Other combinations of the various diffraction patterns discussed herein can also be implemented.

Additionally, as discussed in relation to FIGS. 14A-15B, the polarization state emitted by the individual light emitters can be modified prior to diffraction by the polarization multiplexed diffractive optical element, thereby changing the diffraction patterns generated in the far field. Accordingly, an additional level of control is provided to the system operator since, in addition to activation of the light emitters to produce the desired diffraction pattern as discussed herein, the polarization state of the emitted light could be modified in order to produce other diffraction patterns. In particular, a light emitter having a single polarization could be utilized in conjunction with a polarization rotator in order to produce different diffraction patterns depending on the polarization state of the incident light produced via control of the polarization rotator. One of ordinary skill in the art would recognize many variations, modifications, and alternatives.

Embodiments of the present disclosure can also utilize polarization multiplexing to generate and detect multiple diffraction patterns concurrently or simultaneously. Consider, for example, a robotic system that utilizes multiple structured light emitter patterns in its field of operation to achieve safe navigation. These multiple patterns can be multiplexed spatially, temporally, in wavelength, and/or in polarization. Often, there is a small set of optical wavelengths available for use in these systems. For instance, system constraints may include operation in the near infrared, maintaining low-to-no visibility to the human eye, using available LED or laser light sources, and/or using CMOS image sensors. These constraints can limit the available spectral band to approximately 750-1,000 nm. Moreover, imaging filter capabilities used to separate out specific bands can limit the number of wavelength channels to three or less, resulting in the use of light with wavelengths of 770 nm, 850 nm, and 940 nm. However, operating at these wavelengths, spectral bleed-through can occur (i.e., an optical bandpass filter for one wavelength channel may still pass light at another wavelength channel, which is particularly true for absorptive optical bandpass filters that pass longer wavelengths outside of their passbands). When this spectral (i.e., wavelength) bleed-through exists between channels, the system may be adversely impacted by the resulting optical cross-talk or may have to find additional ways to mitigate the optical cross-talk, for example, by spatially separating the structured light emitter projection patterns, temporally separating the structured light emitter projection patterns, or using polarization to separate the structured light emitter projection patterns. Using the polarization multiplexed structured light emitters discussed herein, the system can enjoy a doubling of the available channel count, and/or significantly reduce the cross-talk that might occur between two different spectral channels that spatially and/or temporally overlap.

Thin Lens Imaging

The thin lens equation relating a lens' focal length, f, the image distance, V, and the object distance, W, is expressed as $$\frac{1}{f} = \frac{1}{V} + \frac{1}{W} \tag{A1.1}$$

This equation can be rearranged to solve for the image distance, V, at which a scene will come to focus for a given object distance, W, as $$V = \frac{W \cdot f}{W - f} \tag{A1.2}$$

If the lens' focal length, f, varies with the polarization state of the incoming light, then, even for the same object distance, the best-focus image distance will vary correspondingly. In a polarization multiplexed structured light emitter, wherein the object distance is the distance between the light emitter array (e.g., the VCSEL array) and the imaging lens, the resulting image distances can be made to be different for different VCSEL light polarization states.

FIG. 12 is a plot showing transmittance and reflectance as a function of the angle of incidence for s-polarized and p-polarized light. In FIG. 12, interface transmittance and reflectance are plotted for s-polarized and p polarized light for $n_1=1$ and $n_2=1.5$. As illustrated in FIG. 12, the polarization-dependent Fresnel reflectivity expresses, mathematically, how light reflects at the interface between materials of two different refractive indices, n. As it turns out, this interface reflectivity varies not only with angle of incidence, $\beta$, and refractive index, n, but also polarization. The interface reflectivity can thus be expressed for s-polarization (light polarized orthogonal to the plane of incidence) and p-polarization (light polarized in the plane of incidence) as, $$R_s = \left| \frac{n_1 \cdot \cos\beta - n_2 \cdot \sqrt{1 - \left(\frac{n_1 \cdot \sin\beta}{n_2}\right)^2}}{n_1 \cdot \cos\beta + n_2 \cdot \sqrt{1 - \left(\frac{n_1 \cdot \sin\beta}{n_2}\right)^2}} \right|^2 \tag{A2.1}$$

$$R_p = \left| \frac{n_1 \cdot \sqrt{1 - \left(\frac{n_1 \cdot \sin\beta}{n_2}\right)^2} - n_2 \cdot \cos\beta}{n_1 \cdot \sqrt{1 - \left(\frac{n_1 \cdot \sin\beta}{n_2}\right)^2} + n_2 \cdot \cos\beta} \right|^2 \tag{A2.2}$$

These equations can be plotted to show how p-polarized light has a lower interface reflectivity than s polarized light, and that, at the Brewster angle, the reflectivity of p-polarized light goes to zero as shown in FIG. 12.

Figure 13:
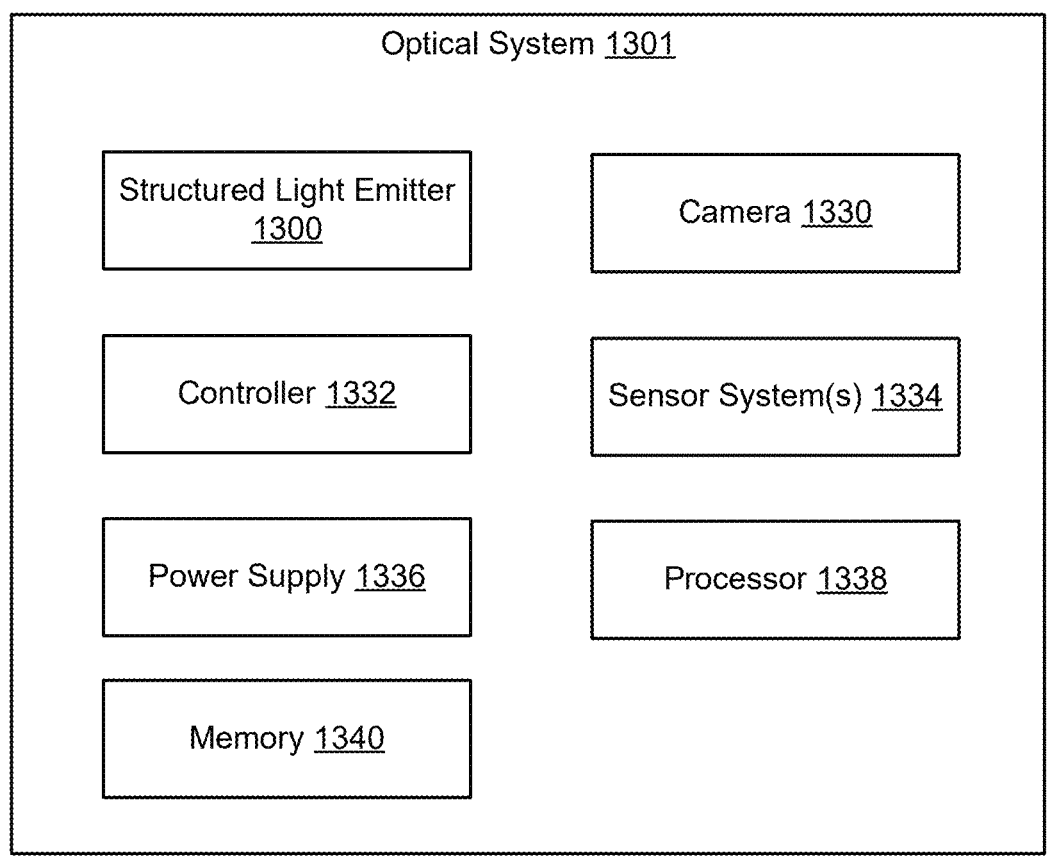
FIG. 13 illustrates an optical system including a polarization multiplexed structured light emitter according to an embodiment of the present disclosure.

FIG. 13 illustrates an optical system 1301 including a polarization multiplexed structured light emitter according to an embodiment of the present disclosure. The optical system can be utilized in image recognition systems including computer-vision applications. The optical system 1301 may include a camera 1330, a controller 1332, a polarization multiplexed structured light emitter 1300, and a set of sensor system(s) 1334, among other components installed on a substrate (e.g., a power supply 1336, a processor 1338, and a memory 1340). Light is emitted from the polarization multiplexed structured light emitter 1300 and generates a structured light array in a far field so that image data can be generated by the camera polarization multiplexed 30 to show an illuminated object (not shown in FIG. 1). The image data may be analyzed by the processor 1338 in support of the user-related application. For instance, within the context of depth sensing, the time-of-flight of the light is measured to determine the distance between the camera 1330 and the illuminated object. The sensor system(s) 1334 may include sensing circuitry to measure a set of electrical parameters associated with an electrically conductive material, such as a current sense amplifier, an analog to digital converter (ADC), and a voltage comparator, among other components. The controller 1332 may control the power to one or more light emitter arrays (e.g., structured light array 122 in FIG. 1).

The processor 1338 may be implemented as appropriate in hardware, computer-executable instructions, software, firmware, or combinations thereof. Computer-executable instruction, software, or firmware implementations of the processor 1338 may include computer-executable or machine-executable instructions written in any suitable programming language to perform the various functions described. The memory 1340 may store program instructions that are loadable and executable on the processor 1338, as well as data generated during the execution of these programs. Depending on the configuration and type of memory, the memory 1340 may be volatile (such as RAM and/or non-volatile (such as read-only memory ("ROM"), flash memory, or other memory)). The memory 1340 may include an operating system and one or more application programs, modules, or services for implementing the features disclosed herein including at least light projection.

Embodiments of the present disclosure, for example, as illustrated in FIG. 13, have commercial value at several levels. As an example, use of provides several key advantages over systems using unpolarized structured light emitters. As an example, embodiments of the present disclosure provide eye safety. In the case where the projected light pattern is emitted downward toward a floor, emitted power requirements can be reduced using vertically-polarized light (i.e., light polarized parallel to the plane of incidence with the floor), as can be seen through Fresnel's equations as discussed in relation to FIG. 12. In this manner, to maintain a certain detectability of the projected light, less vertically-polarized light would be utilized than horizontally-polarized or unpolarized light. As an example, up to two times less vertically-polarized light can be utilized relative to a system using unpolarized light). This improves eye safety by using less emitted light power for a given light detectability.

Moreover, embodiments of the present disclosure enable a reduction in component count and cost. Using a polarization multiplexed diffractive optical element in conjunction with a polarization multiplexed VCSEL array, multiple structured light patterns can be generated from a single component, thereby reducing not only component count but also component cost (i.e., multiplexing two patterns into a single structured light emitter can reduce the cost of the spatial light emitters by half. Channel count can be increased while isolation between channels is also increased. The total number of structured light emitter channels in a system can double when using polarization multiplexing, and/or the isolation between channels may be considerably increased using polarization multiplexing. This will result in higher field of operation coverage and more-reliable spatial light pattern data reception, which both result in safer and smarter robotic systems. Moreover, assembly simplicity and industrial design (ID) improvements are enabled by embodiments of the present disclosure. As will be evident to one of skill in the art, managing a single structured light emitter (versus two structured light emitters) is simpler and the ID can also benefit as fewer emission windows/locations are required on a device.

Furthermore, embodiments of the present disclosure leverage benefits provided by meta-optics in comparison to polymer optics. in addition to the use of polymer-based diffractive optical elements, embodiments of the present disclosure can utilize meta-optic-based diffractive optical elements. Using a meta-optic-based diffractive optical element, several advantages are provided as described herein. These advantages include achieving far greater wavefront manipulation and control due to the higher spatial density in the meta-optic relative to the polymer optics and the higher refractive index step in the meta-optic relative to the polymer optic. Additionally, it is possible to achieve far greater environmental robustness in the meta-optic due to the fact that it can be completely embedded within glass. Moreover, an imaging lens utilized in a structured light emitter, as well as additional optical components, can be integrated into the same optical surface layer as the diffractive optical element structure, reducing system assembly complexity and increasing eye safety. As an example, if the diffractive optical element breaks off in a meta-optic-based structured light emitter that integrates a VCSEL collimating lens with the diffractive optical element structure, then the component will output uncollimated laser light, whereas if the diffractive optical element breaks off in a polymer-based structured light emitter that uses a separate collimating lens and diffractive optical element, then the component will output collimated laser light, which can present eye safety concerns. Finally, polarization multiplexing can be achieved in a single layer, thereby enabling one or more of the concepts disclosed herein.

Figure 14A:
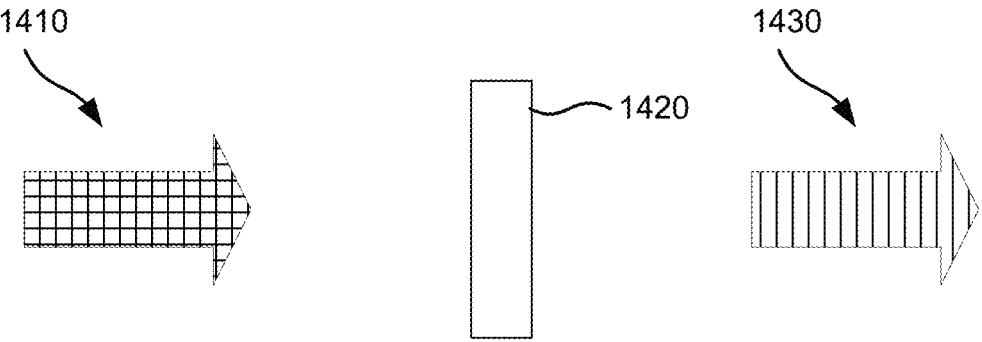
FIG. 14A is a simplified side view of a polarizer according to an embodiment of the present disclosure.
Figure 14B:
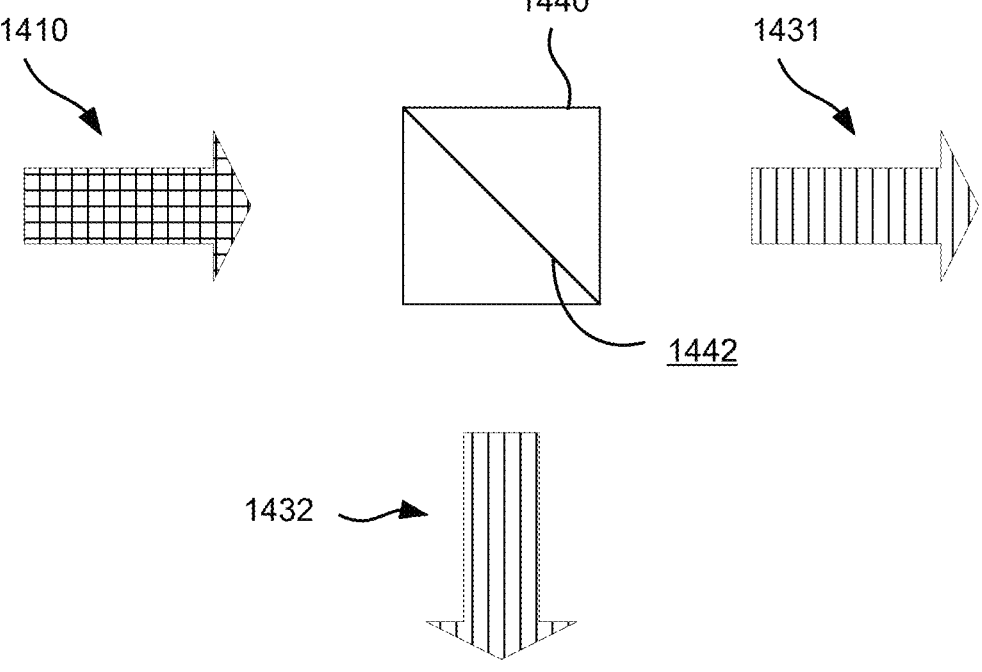
FIG. 14B is a simplified side view of a polarizer according to another embodiment of the present disclosure.

Embodiments of the present disclosure can implement a polarization multiplexed light emitter array (e.g., a polarization multiplexed VCSEL array) in a variety of formats. As an example, it is possible to build a polarization multiplexed VCSEL array starting with a non-polarization multiplexed VCSEL array. Two main classes of polarization multiplexed VCSEL arrays are discussed herein: 1) polarizing an unpolarized light source, and 2) rotating the polarization state of a polarized light source. In FIGS. 14A and 14B, two main methods by which an unpolarized light source can be polarized are illustrated.

FIG. 14A is a simplified side view of a polarizer according to an embodiment of the present disclosure. In FIG. 14A, a first method that uses an absorptive polarizer is illustrated. Unpolarized incident light beam 1410, which can be produced using an unpolarized light emitter, impinges on absorptive polarizer 1420, which can be a linear polarizer. The unpolarized incident light beam 1410 is polarized by the absorptive polarizer 1420 to produce polarized output light beam 1430. As an example, the unpolarized incident light beam 1410 can include both s-polarized and p-polarized light and the polarized output light beam 1430 can include only substantially p-polarized light.

FIG. 14B is a simplified side view of a polarizer according to another embodiment of the present disclosure. In FIG.

14B, a second method that uses a reflective polarizer is illustrated. Unpolarized incident light beam 1410, which can be produced using an unpolarized light emitter, impinges on the reflective polarizer 1440, which can be a polarizing beam splitter. The unpolarized incident light beam 1410 is polarized by the reflective polarizer 1440 to produce first polarized output light beam 1431 and second polarized output light beam 1432 reflected from the interface 1442 of the reflective polarizer. As an example, the unpolarized incident light beam 1410 can include both s-polarized and p-polarized light, the first polarized output light beam 1431 can include only substantially p-polarized light and the second polarized output light beam 1432 can include only substantially s-polarized light.

Figure 15A:
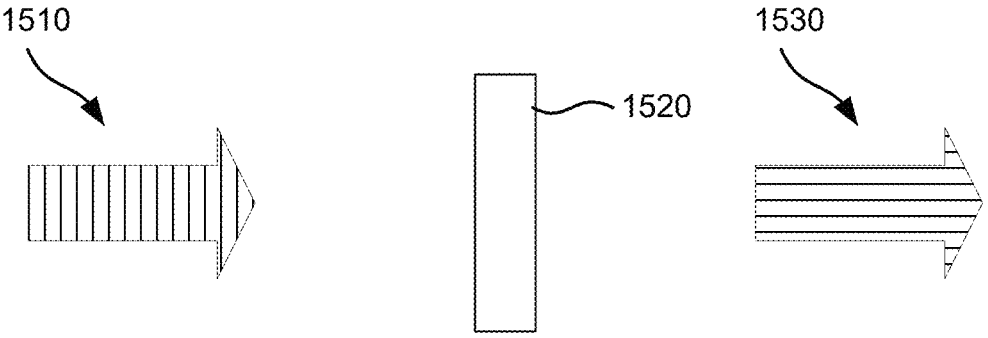
FIG. 15A is a simplified side view of a polarization rotator according to an embodiment of the present disclosure.
Figure 15B:
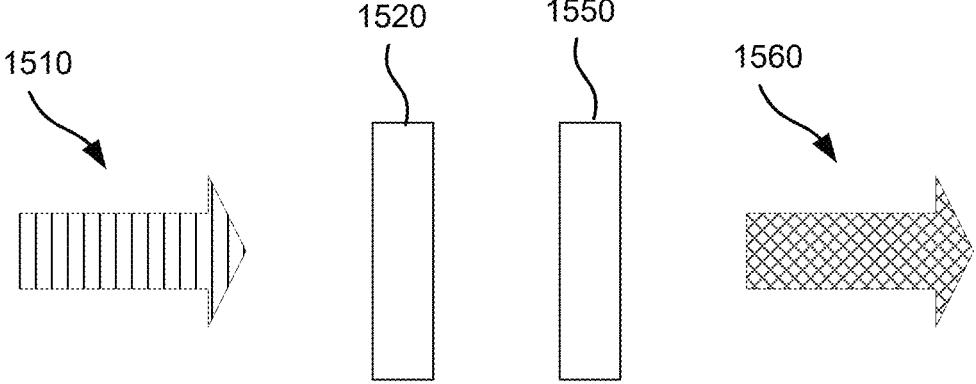
FIG. 15B is a simplified side view of a polarization rotator according to another embodiment of the present disclosure.

FIGS. 15A and 15B illustrate two methods by which a polarized light source can have its polarization state altered using an electro-optic waveplate.

FIG. 15A is a simplified side view of a polarization rotator according to an embodiment of the present disclosure. A first method illustrated in FIG. 15A rotates one linear polarization into an orthogonal linear polarization (or not) using an electro-optic half wave plate whose axes are rotated 45 degrees relative to the incoming light's polarization axis. Thus, in FIG. 15A, polarized incident light beam 1510, which can be in the p-polarization state, impinges on the electro-optic half wave plate 1520, which can include twisted nematic liquid crystal layers that adiabatically rotate an incoming light's polarization state. The electro-optic half wave plate 1520 can be tunable and operable in at least two states, for example, rotating the polarization by 90° or not introducing polarization rotation. The polarization state of the polarized incident light beam 1510 is rotated by the electro-optic half wave plate 1520 to produce polarized output light beam 1530 in which the polarization state is orthogonal to the polarized incident light beam 1510. As an example, the polarized incident light beam 1510 can include only substantially p-polarized light and the polarized output light beam 1530 can include only substantially p-polarized light.

FIG. 15B is a simplified side view of a polarization rotator according to another embodiment of the present disclosure. The second method illustrated in FIG. 15B supplements the first method illustrated in FIG. 15A by the insertion of a fixed quarter wave plate 1550 whose axes are aligned with the half wave plate's axes to generate either right-handed circular polarization or left-handed circular polarization in the output light (depending on the state of the input linear polarization). Thus, referring to FIG. 15B, polarized incident light beam 1510, which can be in the p-polarization state, impinges on the electro-optic half wave plate 1520. The polarization state of the polarized incident light beam 1510 is rotated by the electro-optic half wave plate 1520 and then passes through the fixed quarter wave plate 1550 to produce circularly polarized output light beam 1560. As an example, the circularly polarized incident light beam 1510 can include only light that is substantially in either a right-handed (RH) circular polarization state or a left-handed (LH) circular polarization state.

Electro-optic waveplates are often twisted nematic liquid crystal layers that adiabatically rotate an incoming light's polarization state, wherein the electro-optic waveplate acts as a waveplate when no external voltage is applied across its faces, or as a non-impacting optical plate when the correct voltage is applied across its faces. Either of these polarization control approaches can be used in conjunction with polarization multiplexed structured light emitters discussed herein.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A system, comprising:
a housing;
a light emission source positioned within the housing and including a first, one-dimensional light emitter array characterized by a first polarization state and a second, two-dimensional light emitter array characterized by a second polarization state orthogonal to the first polarization state, wherein light emitted by the light emission source is configured to propagate along an optical axis;
a lens positioned within the housing along the optical axis; and
a wavefront modification element positioned within the housing along the optical axis, wherein the wavefront modification element comprises a polarization-sensitive diffractive structure.

2. The system of claim 1, wherein the polarization-sensitive diffractive structure is configured to generate, in a far field, a first diffraction pattern corresponding to the first, one-dimensional light emitter array and a second diffraction pattern corresponding to the second, two-dimensional light emitter array.

3. The system of claim 2, wherein the second, two-dimensional light emitter array is operable to produce a plurality of emissions and the second diffraction pattern comprises a plurality of structured light patterns, wherein each structured light pattern of the plurality of structured light patterns comprises a replica of the plurality of emissions.

4. The system of claim 2, wherein:
the first diffraction pattern is arrayed in one direction; and
the second diffraction pattern is distributed in two directions.

5. The system of claim 1, further comprising a prism, wherein at least one of the lens or the prism are polarization-sensitive.

6. The system of claim 1, wherein:
the first, one-dimensional light emitter array comprises vertical cavity surface emitting lasers (VCSELs); and
the second, two-dimensional light emitter array comprises a pseudo-random distribution of VCSELs.

7. A system, comprising:
a housing;
a polarized light emission source disposed in the housing and operable to emit light along an optical axis, wherein the polarized light emission source includes a plurality of light emitters, wherein a first subset of the plurality of light emitters is arrayed as a first array including a first number of light emitters arrayed in an array direction by an array dimension and characterized by a first polarization state and a second subset of the plurality of light emitters is arrayed as a second array including the first number of light emitters arrayed in the array direction by the array dimension and characterized by a second polarization state orthogonal to the first polarization state, wherein the second array is offset from the first array in the array direction by half of the array dimension; and
a wavefront modification element positioned within the housing along the optical axis, wherein the wavefront modification element comprises a polarization-sensitive diffractive structure configured to generate, in a far field, a first diffraction pattern corresponding to the first subset of the plurality of light emitters and a second diffraction pattern corresponding to the second subset of the plurality of light emitters.

8. The system of claim 7, wherein:

the first subset of the plurality of light emitters; and the second subset of the plurality of light emitters are operable to be operated independently.

9. The system of claim 7, wherein the polarization-sensitive diffractive structure implements an imaging lens function.

10. The system of claim 9, wherein the polarization-sensitive diffractive structure implements a prism function or further comprising a prism positioned within the housing along the optical axis.

11. The system of claim 7, wherein:

the first subset of the plurality of light emitters comprises a first number of light emitters aligned in a direction; and the first diffraction pattern comprises a plurality of structured light patterns, wherein each structured light pattern of the plurality of structured light patterns comprises a replica of the first number of light emitters.

12. The system of claim 11, wherein the plurality of structured light patterns are aligned along the direction.

13. The system of claim 7, wherein the first diffraction pattern is focused at a first distance from the wavefront modification element and the second diffraction pattern is focused at a second distance from the wavefront modification element, the first distance being less than the second distance.

14. A system comprising:

a housing;

a polarized light emission source disposed in the housing and operable to emit light along an optical axis, wherein the polarized light emission source includes a plurality of light emitters, wherein a first subset of the plurality of light emitters is characterized by a first polarization state and a second subset of the plurality of light emitters is characterized by a second polarization state orthogonal to the first polarization state; and a wavefront modification element positioned within the housing along the optical axis, wherein the wavefront modification element comprises a polarization-sensitive diffractive structure configured to generate, in a far field, a first diffraction pattern corresponding to the first subset of the plurality of light emitters and having a first field of irradiation and a second diffraction pattern corresponding to the second subset of the plurality of light emitters and having a second field of irradiation different than the first field of irradiation.

15. The system of claim 14, wherein the second field of irradiation is larger than the first field of irradiation and the first field of irradiation is disposed inside the second field of irradiation.

16. The system of claim 14, wherein the first field of irradiation covers a first area in the far field and the second field of irradiation covers a second area different from the first area in the far field.

17. The system of claim 14, wherein:

the first subset of the plurality of light emitters is arrayed as a first array including a predetermined number of light emitters arrayed in an array direction by an array dimension;

the second subset of the plurality of light emitters is arrayed as a second array including the predetermined number of light emitters arrayed in the array direction by the array dimension; and the second array is offset from the first array in the array direction by half of the array dimension.

18. The system of claim 14, the first subset of the plurality of light emitters and the second subset of the plurality of light emitters are operable to be operated independently.

19. The system of claim 14, wherein at least one of the first diffraction pattern or the second diffraction pattern is characterized by a substantially uniform beam profile.

20. The system of claim 14, wherein:

the polarization-sensitive diffractive structure implements an imaging lens function and a quarter wave plate;

the first diffraction pattern is characterized by a first elliptical polarization state; and the second diffraction pattern is characterized by a second elliptical polarization state having a handedness opposite to the first elliptical polarization state.

* * * * *